US012787431B2

(12) United States Patent
Wan et al.

(10) Patent No.: US 12,787,431 B2
(45) Date of Patent: Nov. 3, 2026

(54) DISPLAY SUBSTRATE INCLUDING CONDUCTIVE CONNECTION ELECTRODE, PREPARATION METHOD THEREOF, AND DISPLAY APPARATUS

(71) Applicants: Chongqing BOE Optoelectronics Technology Co., Ltd., Chongqing (CN); BOE Technology Group Co., Ltd., Beijing (CN)

(72) Inventors: Bin Wan, Beijing (CN); Xiaoyuan Wang, Beijing (CN); Hui Guo, Beijing (CN); Chen Xu, Beijing (CN); Jiandong Guo, Beijing (CN); Zhongshan Wu, Beijing (CN); Guodong Yang, Beijing (CN); Junming Chen, Beijing (CN); Yan Liu, Beijing (CN)

(73) Assignees: Chongqing BOE Optoelectronics Technology Co., Ltd., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 353 days.

(21) Appl. No.: 18/292,106

(22) PCT Filed: Sep. 28, 2022

(86) PCT No.: PCT/CN2022/121957
§ 371 (c)(1),
(2) Date: Jan. 25, 2024

(87) PCT Pub. No.: WO2024/065235
PCT Pub. Date: Apr. 4, 2024

(65) Prior Publication Data
US 2025/0113610 A1 Apr. 3, 2025

(51) Int. Cl.
*H10D 86/40* (2025.01)
*G02F 1/1333* (2006.01)
(Continued)

(52) U.S. Cl.
CPC ..... *H10D 86/441* (2025.01); *G02F 1/133345* (2013.01); *G02F 1/134309* (2013.01);
(Continued)

(58) Field of Classification Search
CPC ................ H10D 86/441; H10D 86/451; G02F 1/133345; G02F 1/134309
(Continued)

(56) References Cited

U.S. PATENT DOCUMENTS

| | | | |
|---|---|---|---|
| 2003/0128323 | A1 | 7/2003 | Matsumoto et al. |
| 2009/0103035 | A1 | 4/2009 | Suzuki et al. |

(Continued)

FOREIGN PATENT DOCUMENTS

| | | | |
|---|---|---|---|
| CN | 102023432 | A | 4/2011 |
| CN | 103489824 | A | 1/2014 |

(Continued)

OTHER PUBLICATIONS

Translation of WO 2019/205922 (Year: 2019).*
Extended European Search Report issued on Oct. 17, 2025, for application No. EP22959884.2.

*Primary Examiner* — Jami Valentine Miller
(74) *Attorney, Agent, or Firm* — Nath, Goldberg & Meyer; Joshua B. Goldberg

(57) ABSTRACT

A display substrate, including: a first base substrate, including a display region and a peripheral region surrounding the display region; at least one common voltage line in the display region, each being configured with at least one conductive connection region; a first passivation layer on a side of the common voltage line away from the first base
(Continued)

substrate; a common electrode on a side of the first passivation layer away from the first base substrate; a second passivation layer on a side of the common electrode away from the first base substrate; a pixel electrode on a side of the second passivation layer away from the first base substrate; and a first conductive connection electrode in the corresponding conductive connection region and in the same layer as the pixel electrode, where the common electrode is electrically connected to the common voltage line through the first conductive connection electrode.

19 Claims, 19 Drawing Sheets

(51) Int. Cl.
*G02F 1/1343* (2006.01)
*G02F 1/1362* (2006.01)
*G02F 1/1368* (2006.01)

(52) U.S. Cl.
CPC .. *G02F 1/136227* (2013.01); *G02F 1/136286* (2013.01); *G02F 1/1368* (2013.01); *H10D 86/451* (2025.01)

(58) Field of Classification Search
USPC ........................................................ 257/72
See application file for complete search history.

(56) References Cited

U.S. PATENT DOCUMENTS

| | | | | |
|---|---|---|---|---|
| 2015/0380671 | A1 | 12/2015 | Shu et al. | |
| 2016/0035760 | A1* | 2/2016 | Ning | H10D 86/021 438/151 |
| 2021/0408081 | A1* | 12/2021 | Liu | H10D 30/6755 |

FOREIGN PATENT DOCUMENTS

| | | | | |
|---|---|---|---|---|
| CN | 103489826 | A | 1/2014 | |
| CN | 105161495 | A | 12/2015 | |
| CN | 106932984 | A | 7/2017 | |
| CN | 108598087 | A | 9/2018 | |
| CN | 111916464 | A | 11/2020 | |
| CN | 112382638 | A | 2/2021 | |
| CN | 108470717 | B | 4/2021 | |
| CN | 113394166 | A | 9/2021 | |
| EP | 3343274 | A2 | 7/2018 | |
| EP | 3761366 | A1 | 1/2021 | |
| WO | WO-2019205922 | A1 * | 10/2019 | G02F 1/136227 |

* cited by examiner

DISPLAY SUBSTRATE INCLUDING CONDUCTIVE CONNECTION ELECTRODE, PREPARATION METHOD THEREOF, AND DISPLAY APPARATUS

This is a National Phase Application filed under 35 U.S.C. 371 as a national stage of PCT/CN2022/121957, filed Sep. 28, 2022, the content of each of which is hereby incorporated by reference in its entirety.

TECHNICAL FIELD

The present disclosure relates to the field of display, and particularly relates to a display substrate, a preparation method thereof, and a display apparatus.

BACKGROUND

To improve a viewing angle of a liquid crystal display (LCD), a liquid crystal display technical mode called advanced super dimension switch (ADS) has been proposed. In an ADS mode display apparatus, a pixel electrode and a common electrode are disposed on a same display substrate.

SUMMARY

In a first aspect, an embodiment of the present disclosure provides a display substrate, including:

- a first base substrate, including a display region and a peripheral region surrounding the display region;
- at least one common voltage line in the display region, each common voltage line being configured with at least one conductive connection region;
- a first passivation layer on a side of the common electrode line away from the first base substrate;
- a common electrode on a side of the first passivation layer away from the first base substrate;
- a second passivation layer on a side of the common electrode away from the first base substrate;
- a pixel electrode on a side of the second passivation layer away from the first base substrate; and
- a first conductive connection electrode in a corresponding one of the at least one conductive connection region and in the same layer as the pixel electrode, where the common electrode is electrically connected to the common voltage line through the first conductive connection electrode.

In Some Embodiments, the Display Substrate Further Includes:

- a plurality of thin film transistors between the first base substrate and the first passivation layer;
- where the common voltage line is in the same layer as a gate of each thin film transistor.

In some embodiments, a first electrode and a second electrode of each thin film transistor are on a side of the gate of the thin film transistor away from the first base substrate, with an insulation layer between the first and second electrodes of the thin film transistor and the gate of the thin film transistor; and the display substrate further includes:

- a second conductive connection electrode in the corresponding conductive connection region and in the same layer as the first electrode and the second electrode of the thin film transistor, wherein the second conductive connection electrode is in contact with the common voltage line through a first via in the insulation layer; and

- the first conductive connection electrode is electrically connected to the common voltage line through the second conductive connection electrode.

In some embodiments, in the conductive connection region, a second via communicating from a surface of the second passivation layer away from the first base substrate to the second conductive connection electrode, and a third via communicating from the surface of the second passivation layer away from the first base substrate to the common electrode, are formed; and

- the first conductive connection electrode is in contact with the corresponding second conductive connection electrode through the second via, and the first conductive connection electrode is in contact with a portion of the common electrode in the conductive connection region through the third via.

In Some Embodiments, the Display Substrate Further Includes:

- a plurality of gate lines and a plurality of data lines, wherein each of the gate lines extend in a first direction, each of the data lines extend in a second direction, the first direction is intersected with the second direction, and the plurality of gate lines and the plurality of data lines define a plurality of pixel regions arranged in an array along the first direction and the second direction;
- each pixel region includes an emission region and a non-emission region arranged in the second direction, and the non-emission region is closer to a gate line corresponding to the pixel region than the emission region;
- the non-emission region is formed with a corresponding thin film transistor and further a fourth via communicating from the surface of the second passivation layer away from the first base substrate to the second electrode of the thin film transistor, while the emission region is formed with the pixel electrode;
- a gate of the thin film transistor is electrically connected to a corresponding gate line, a first electrode of the thin film transistor is electrically connected to a corresponding data line, and the pixel electrode is electrically connected to a second electrode of the thin film transistor through the corresponding fourth via; and
- an extending direction of the common voltage line is parallel to an extending direction of the gate line, and the common voltage line is in the non-emission region and on a side of the thin film transistor close to the emission region.

In some embodiments, the second via and the third via are both in the non-emission region and between the corresponding common voltage line and gate line.

In some embodiments, the second via and the third via are arranged in the second direction.

In some embodiments, the second via and the fourth via are arranged in the first direction; and

- the third via and the fourth via are arranged in the first direction.

In some embodiments, in the second direction, distances from the first conductive connection electrode to two pixel electrodes which are adjacent in the second direction are the same.

In some embodiments, in the conductive connection region, a fifth via communicating from the surface of the second passivation layer away from the first base substrate to the second conductive connection electrode and the common electrode is formed; and

- the second via is a portion of the fifth via that is in communication with the second conductive connection electrode, while the third via is a portion of the fifth via that is in communication with the common electrode.

In some embodiments, for any fifth via, a bottom of the fifth via has a first orthographic projection on the first base substrate, and a portion of the common electrode exposed from the fifth via has a second orthographic projection on the first base substrate; and an area of the second orthographic projection is half an area of the first orthographic projection.

In some embodiments, an edge of the second orthographic projection passes through a center of the first orthographic projection.

In some embodiments, the first orthographic projection has a first rectangle shape, and the second orthographic projection has a second rectangle shape;

a length of the first rectangle in the first direction is half a length of the second rectangle in the first direction; and a length of the first rectangle in the second direction is equal to a length of the second rectangle in the second direction.

In some embodiments, the fifth via and the first via are arranged in the second direction.

In some embodiments, a center of an orthographic projection of the fifth via on the first base substrate is overlapped with a center of an orthographic projection of the first conductive connection electrode on the first base substrate.

In some embodiments, in the same conductive connection region, an orthographic projection of a bottom of the second via on the first base substrate has a first projected area, and an orthographic projection of a bottom of the third via on the first base substrate has a second projected area; and the first projected area is equal to the second projected area.

In some embodiments, in the same conductive connection region, a first contact area is between the first conductive connection electrode and the corresponding second conductive connection electrode, and a second contact area is between the first conductive connection electrode and the portion of the common electrode in the conductive connection region; and the first contact area is equal to the second contact area.

In Some Embodiments, the Display Substrate Further Includes:

a planarization layer between the first passivation layer and the common electrode, wherein in the conductive connection region, the planarization layer is formed with a sixth via into which a portion of the common electrode is located; and an orthographic projection of the sixth via on the first base substrate covers an orthographic projection of the second via on the first base substrate and an orthographic projection of the third via on the first base substrate.

In some embodiments, for any sixth via, the sixth via has a third orthographic projection on the first base substrate, and the portion of the common electrode in the sixth via has a fourth orthographic projection on the first base substrate; and an area of the fourth orthographic projection is half an area of the third orthographic projection.

In some embodiments, an edge of the fourth orthographic projection passes through a center of the third orthographic projection.

In some embodiments, the third orthographic projection has a third rectangle shape, and the fourth orthographic projection has a fourth rectangle shape;

a length of the third rectangle in the first direction is half a length of the fourth rectangle in the first direction; and a length of the fourth rectangle in the second direction is equal to a length of the fourth rectangle in the second direction.

In some embodiments, the orthographic projection of the first conductive connection electrode on the first base substrate covers the orthographic projection of the sixth via on the first base substrate.

In some embodiments, a center of the orthographic projection of the sixth via on the first base substrate is overlapped with the center of the orthographic projection of the first conductive connection electrode on the first base substrate.

In some embodiments, a sidewall of the planarization layer defining the sixth via corresponds to a slope angle between 30° to 80°.

In some embodiments, a sidewall of the first passivation layer defining the second via corresponds to a slope angle between 15° to 50°; and a sidewall of the second passivation layer defining the third via corresponds to a slope angle between 15° to 50°.

In Some Embodiments, the Display Substrate Further Includes:

a common voltage peripheral lead in the peripheral region; wherein the common electrode extends to the peripheral region to be electrically connected to the common voltage peripheral lead.

In some embodiments, two ends of the common voltage line each extend to the peripheral region, and are each electrically connected to the common voltage peripheral lead.

In some embodiments, the common voltage peripheral lead is around the display region;

the display substrate further includes a common voltage write lead in the peripheral region on a side of the common voltage peripheral lead away from the display region; and the common voltage write lead is electrically connected to the common voltage peripheral lead.

In a second aspect, an embodiment of the present disclosure further provides a display apparatus, including: the display substrate according to the first aspect, and an opposite substrate opposite to the display substrate.

In a third aspect, an embodiment of the present disclosure further provides a method for preparing the display substrate according to the first aspect, including:

providing a first base substrate including a display region and a peripheral region surrounding the display region;

forming at least one common voltage line on one side of the first base substrate, wherein the common voltage line is in the display region, and each common voltage line is configured with at least one conductive connection region;

forming a first passivation layer on a side of the common voltage line away from the first base substrate;

forming a common electrode on a side of the first passivation layer far away from the first base substrate;

forming a second passivation layer on a side of the common electrode away from the first base substrate; and forming a pixel electrode and a first conductive connection electrode in the same layer on a side of the second passivation layer away from the first base substrate, wherein the first conductive connection electrode is in a corresponding one of the at least one conductive connection region, and the common electrode is electrically connected to the common voltage line through the first conductive connection electrode.

In some embodiments, before forming the first passivation layer, the method further includes:

forming a thin film transistor and a second conductive connection electrode on one side of the first base substrate, including: forming a gate through a patterning process, forming an active layer through a patterning process, and forming a first electrode, a second electrode, and a second conductive connection electrode through a patterning process; wherein an insulation layer is between the first and second electrodes and the gate, and the second conductive connection electrode is in contact with the common voltage line through a first via in the insulation layer;

wherein the gate and the common electrode line are formed based on the same patterning process; and the first conductive connection electrode is electrically connected to the common voltage line through the second conductive connection electrode.

In some embodiments, forming the first passivation layer, forming the common electrode, forming the second passivation layer, and forming the pixel electrode specifically include:

forming a first passivation material film on a side of the common voltage line away from the first base substrate;

forming a common electrode on a side of the first passivation material film away from the first base substrate through a patterning process;

forming a second passivation material film on a side of the common electrode away from the first base substrate;

patterning the second passivation material film and the first passivation material film through one patterning process, to form in the conductive connection region a second via communicating from a surface of the second passivation layer away from the first base substrate to the second conductive connection electrode, and a third via communicating from the surface of the second passivation layer away from the first base substrate to the common electrode, are formed; and forming the pixel electrode and a first conductive connection electrode through a patterning process, wherein the first conductive connection electrode is in contact with the corresponding second conductive connection electrode through the second via, and the first conductive connection electrode is in contact with a portion of the common electrode in the conductive connection region through the third via.

In some embodiments, the second via and the third via are different portions of the same via.

In some embodiments, between forming the first passivation material film and the forming the common electrode, the method further includes:

forming a planarization layer on the side of the first passivation material film away from the first base substrate through a patterning process, wherein in the conductive connection region, the planarization layer is formed with a sixth via; wherein a portion of the subsequently formed common electrode is into the sixth via, and orthographic projections of the subsequently formed second via and third via on the first base substrate are both within a coverage region of an orthographic projection of the sixth via on the first base substrate.

BRIEF DESCRIPTION OF DRAWINGS

Accompanying drawings are provided for further understanding of the present disclosure and constitute a part of the specification. Hereinafter, these drawings are intended to explain the present disclosure together with the following specific implementations, but should not be considered as a limitation to the present disclosure, in which.

DETAIL DESCRIPTION OF EMBODIMENTS

To make those skilled in the art better understand the technical solutions of the present disclosure, the display substrate, the preparation method thereof, and the display apparatus provided in the present disclosure will be described below in detail in conjunction with the accompanying drawings.

A patterning process in the embodiments of the present disclosure is also referred to as a process of patterning or a MASK process, and specifically includes processes such as photoresist coating, exposure, development, thin film etching, photoresist stripping, and the like. When the material film to be patterned is a photoresist material film, the material film may be patterned through exposure and development processes.

Figure 1:
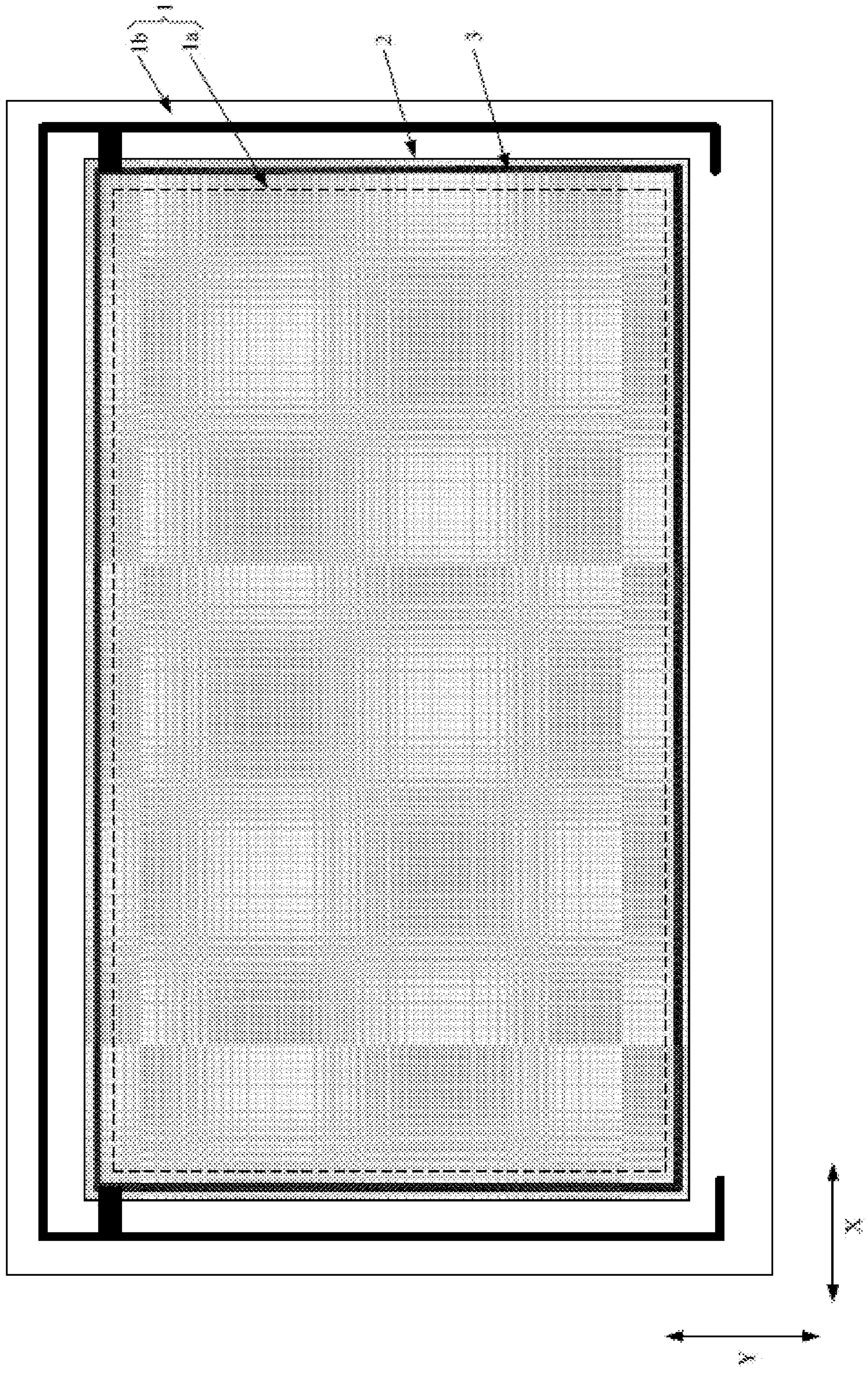
FIG. 1 is a schematic top plan view of a display substrate in the existing art.

FIG. 1 is a schematic top plan view of a display substrate in the existing art. As shown in FIG. 1, the display substrate includes a first base substrate, including a display region 1*a* and a peripheral region 1*b* surrounding the display region 1*a*. The display region 1*a* is provided with a planar common electrode 2, the peripheral region 1*b* is provided with a common voltage peripheral lead 3, the planar common electrode 2 extends to the peripheral region 1*b* to be electrically connected to the common voltage peripheral lead 3, and the common voltage peripheral lead 3 can write a common voltage signal to the planar common electrode 2.

It is found in practical applications that to prevent the common electrode 2 from blocking light emitted from the display region 1*a*, the common electrode 2 is made of a transparent conductive material, typically a metal oxide, such as indium tin oxide (ITO). However, it is also found in practical applications that since the metal oxide has a relatively high resistivity and the planar common electrode 2 has a relatively large size, the common electrode 2 has a relatively large overall resistance; and in the process of writing a common voltage signal to the planar common electrode 2 by the common voltage peripheral lead 3, significant signal delay occurs on the common electrode 2. In addition, in a display apparatus with a high refresh rate, the common voltage signal delay on the common electrode 2 will directly affect the final display effect of the display apparatus.

To reduce the common voltage signal delay on the planar common electrode and improve stability of the common voltage signal, an embodiment of the present disclosure provides a display substrate.

Figure 2:
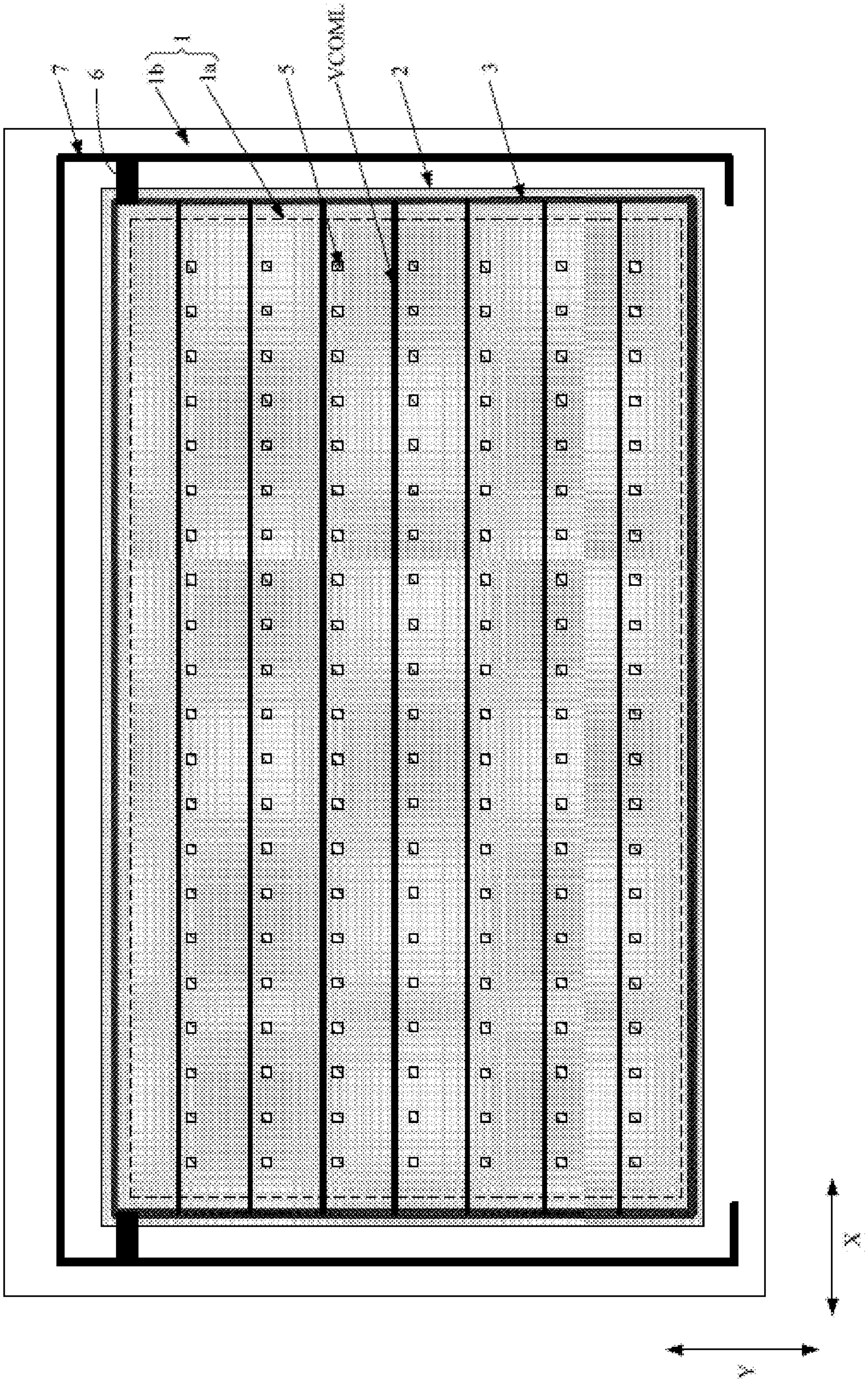
FIG. 2 is a schematic top plan view of a display substrate according to an embodiment of the present disclosure.
Figure 3:
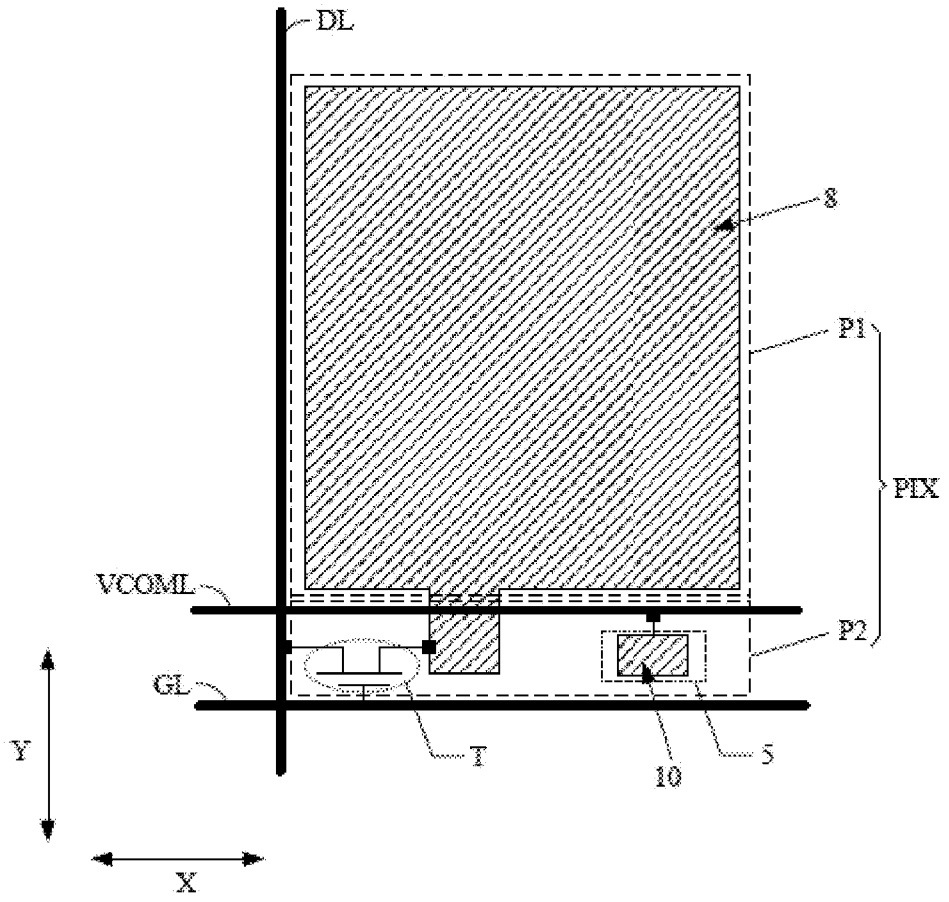
FIG. 3 is a schematic circuitry diagram of a display region according to an embodiment of the present disclosure.
Figure 4:
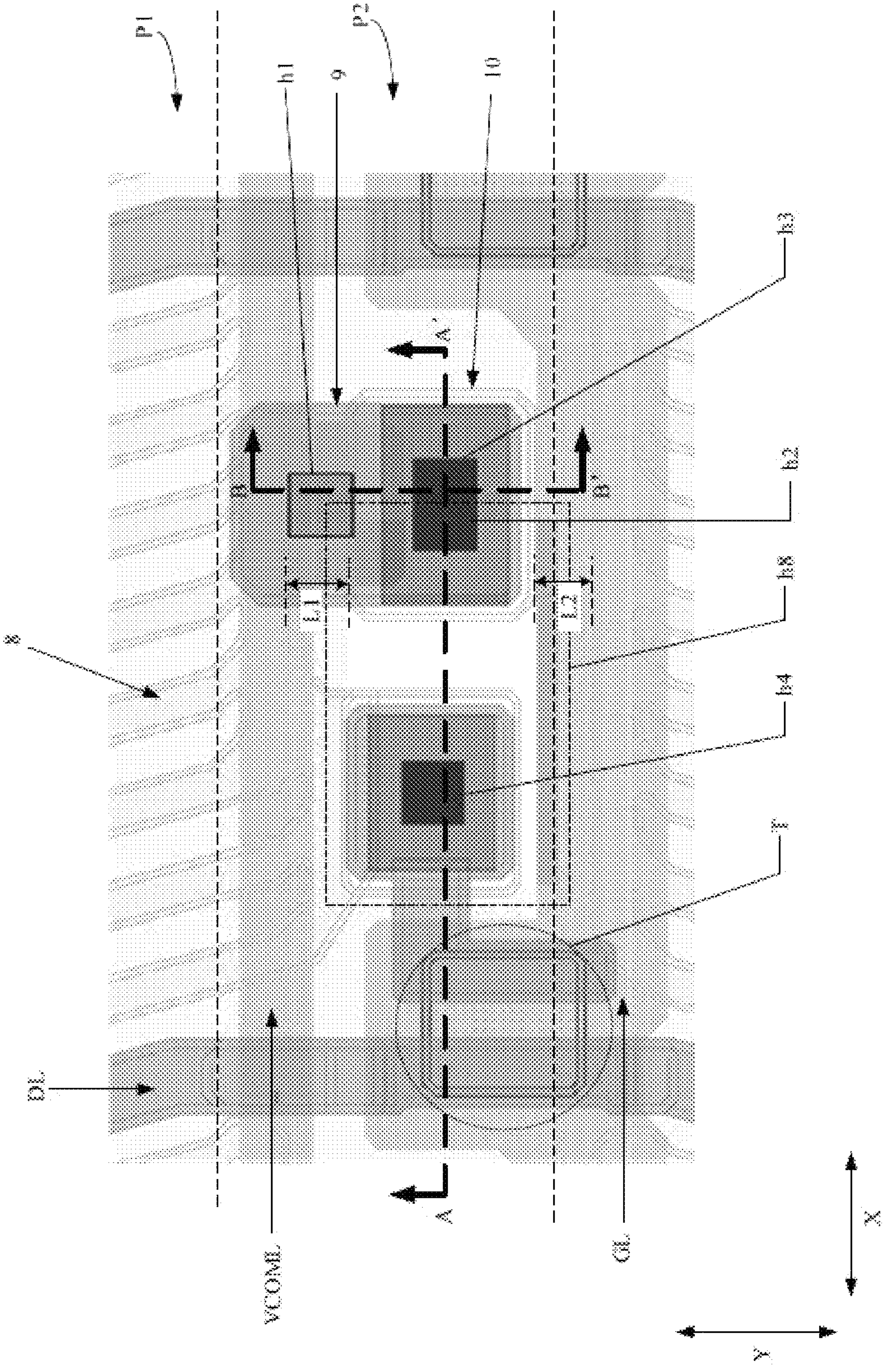
FIG. 4 is a schematic top plan view of a conductive connection region and its vicinity according to an embodiment of the present disclosure.
Figure 5:
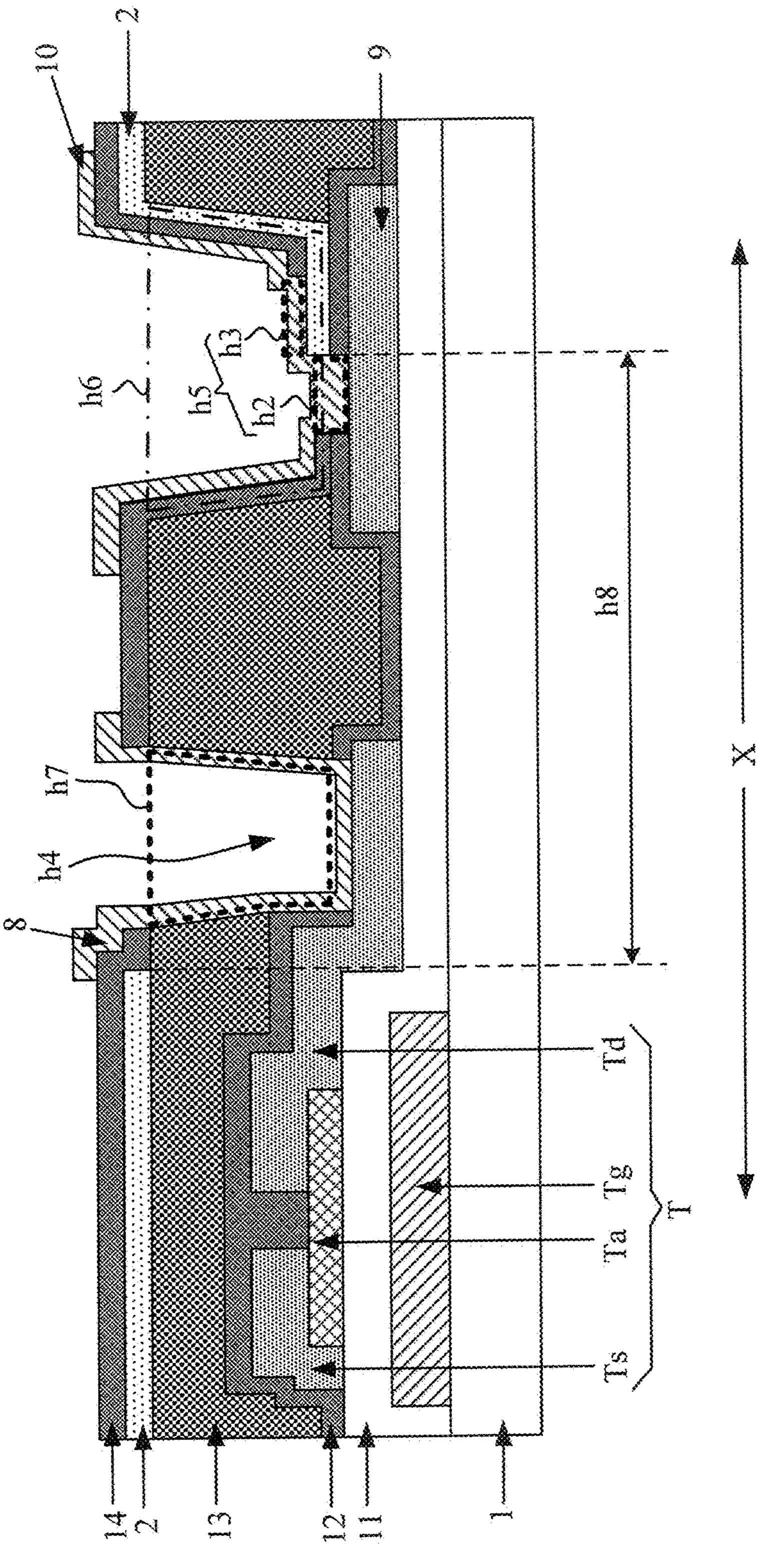
FIG. 5 is a schematic sectional view taken along line A-A' in FIG. 4.
Figure 6:
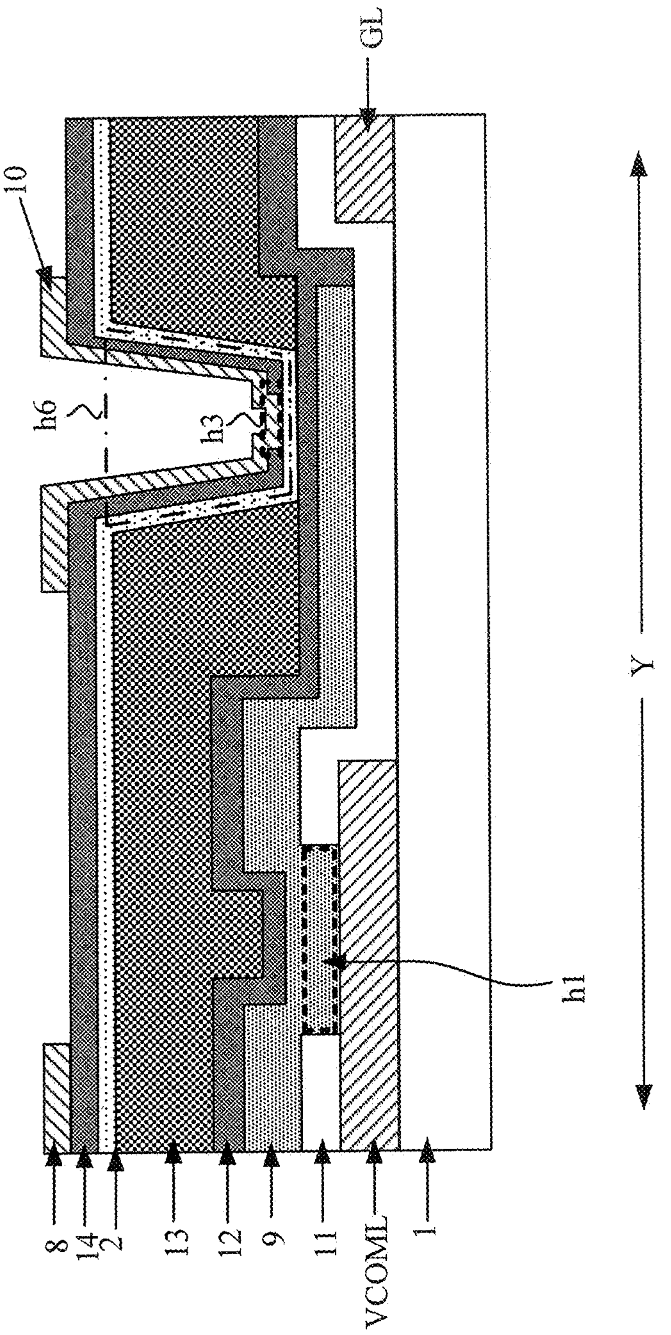
FIG. 6 is a schematic sectional view taken along line B-B' in FIG. 4.
Figure 7:
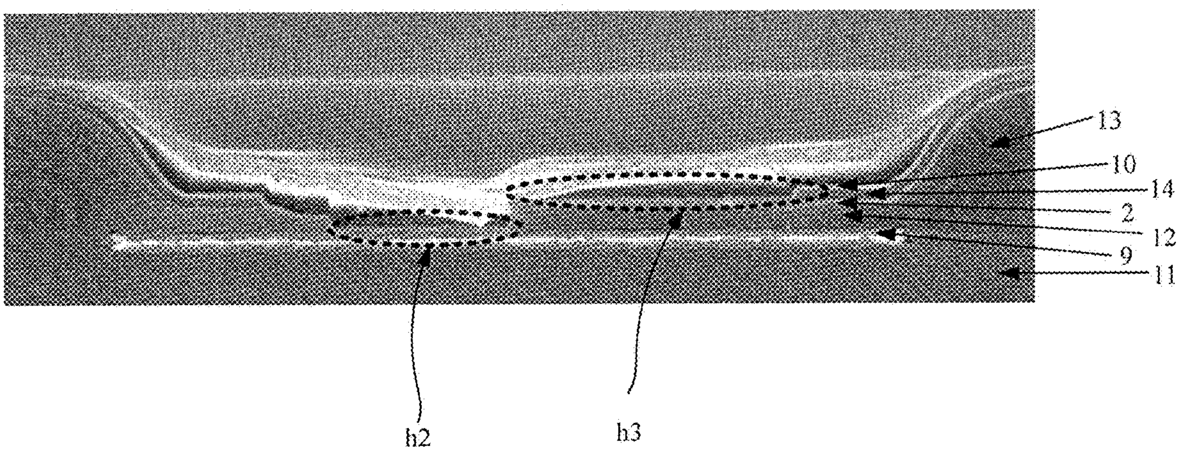
FIG. 7 is a scanning electron microscope view of a section at a second via and a third via according to an embodiment of the present disclosure.

FIG. 2 is a schematic top plan view of a display substrate according to an embodiment of the present disclosure, FIG. 3 is a schematic circuitry diagram of a display region according to an embodiment of the present disclosure, FIG. 4 is a schematic top plan view of a conductive connection region and its vicinity according to an embodiment of the present disclosure, FIG. 5 is a schematic sectional view taken along line A-A' in FIG. 4, FIG. 6 is a schematic sectional view taken along line B-B' in FIG. 4, and FIG. 7 is a scanning electron microscope view of a section at a second via and a third via according to an embodiment of the present disclosure. As shown in FIGS. 2 to 7, the display substrate includes a first base substrate 1, at least one common voltage line VCOML, a first passivation layer 12, a common electrode 2, a second passivation layer 14, a pixel electrode 8, and a first conductive connection electrode 10. The first base substrate 1 includes a display region 1*a* and a peripheral region 1*b* surrounding the display region 1*a*. The common voltage line VCOML is located in the display region 1*a*, and each common voltage line VCOML is configured with at least one conductive connection region 5. The first passivation layer 12 is located on a side of the common electrode 2 line away from the first base substrate 1. The common electrode 2 is located on a side of the first passivation layer 12 away from the first base substrate 1. The second passivation layer 14 is located on a side of the common electrode 2 away from the first base substrate 1. The pixel electrode 8 is located on a side of the second passivation layer 14 away from the first base substrate 1. The first conductive connection electrode 10 is located in the corresponding conductive connection region 5 and disposed in the same layer as the pixel electrode 8, and the common electrode 2 is electrically connected to the common voltage line VCOML through the first conductive connection electrode 10.

In an embodiment of the present disclosure, the peripheral region 1*b* is provided with a common voltage peripheral lead 3, and the common electrode 2 extends to the peripheral region 1*b* to be electrically connected to the common voltage peripheral lead 3 in the peripheral region 1*b*.

In addition, in an embodiment of the present disclosure, the pixel electrode 8 is a slit electrode.

In one aspect, in an embodiment of the present disclosure, the display region 1*a* is provided with common voltage lines VCOM each configured with at least one conductive connection region 5, and the common electrode 2 is electrically connected to each common voltage line VCOML through the first conductive connection electrode 10 in the conductive connection region 5. Compared with the technical solution in the existing art of providing the common voltage signal to the common electrode 2 by only the common voltage peripheral lead 3 in the peripheral region 1*b*, the display substrate provided in the embodiments of the present disclosure can provide the common voltage signal to the common electrode 2 by not only the common voltage peripheral lead 3 in the peripheral region 1*b*, but also the common voltage line VCOML in the display region 1*a*, so that a loading speed of the common voltage signal onto the common electrode 2 can be effectively increased, the common voltage signal delay can be reduced, and the stability of the common voltage signal can be improved.

In another aspect, since the first conductive connection electrode 10 and the pixel electrode 8 are disposed in the same layer in the embodiment of the present disclosure, the first conductive connection electrode 10 and the pixel electrode 8 can be prepared based on a same MASK process, so that the number of MASK processes is not increased due to the provision of the first conductive connection electrode 10.

Meanwhile, rather than being directly connected to the common voltage line VCOML through a via in the first passivation layer 12, the common electrode 2 is electrically connected to the common voltage line VCOML through the first conductive connection electrode 10 on the side of the common electrode 2 away from the first base substrate 1, so that the MASK process for the first passivation layer 12 may be performed after the MASK process for the common electrode 2. In other words, the MASK process for the first passivation layer 12 may be the same as the MASK process for the second passivation layer 14 on the side of the common electrode 2 away from the first base substrate 1 (i.e., the first passivation layer 12 and the second passivation layer 14 are subjected to the MASK process at the same time), so that the number of MASK processes can be effectively reduced.

In some embodiments, the display substrate further includes a plurality of thin film transistors T between the first base substrate 1 and the first passivation layer 12, and the common voltage line VCOML is disposed in the same layer as a gate Tg of each thin film transistor T. In other words, the common voltage line VCOML and the gate Tg of the thin film transistor T may be prepared based on the same MASK process, so that the number of MASK processes is not increased due to the provision of the common voltage line VCOML.

In some embodiments, a first electrode Ts and a second electrode Td of each thin film transistor T are located on a side of the gate Tg of the thin film transistor T away from the first base substrate, with an insulation layer 11 between the first and second electrodes Ts, Tg of the thin film transistor T and the gate Tg of the thin film transistor T.

It should be noted that where the thin film transistor T is a bottom-gate type thin film transistor T, the insulation layer 11 is a gate insulating layer 11 between the gate Tg and an active layer Ta; and where the thin film transistor T is a top-gate type thin film transistor T, the insulation layer 11 is an interlayer dielectric layer between the gate Tg and the first and second electrodes Ts, Td. In an embodiment of the present disclosure, the case of the thin film transistor T being a bottom-gate type thin film transistor T is taken as an example for exemplary illustration, which is merely for exemplary purposes, and does not configure any limitation to the technical solution of the present disclosure.

The display substrate further includes a second conductive connection electrode 9 in the corresponding conductive connection region 5 and disposed in the same layer as the first electrode Ts and the second electrode Td of the thin film transistor T, where the second conductive connection electrode 9 is in contact with the common voltage line VCOML through a first via h1 in the insulation layer 11; and the first conductive connection electrode 10 is electrically connected to the common voltage line VCOML through the second conductive connection electrode 9.

In an embodiment of the present disclosure, instead of providing the second conductive connection electrode 9, if the first conductive connection electrode 10 is directly connected to the common voltage line VCOML through the via, the first conductive connection electrode 10 has to extend, along a sidewall of the corresponding via, from a surface of the second passivation layer 14 away from the first base substrate 1 to a surface of the common voltage line VCOML away from the first base substrate 1. As a result, a relatively large segment difference is generated across the first conductive connection electrode 10, causing a high breaking risk of the first conductive connection electrode 10. In contrast, by providing the second conductive connection electrode 9 and electrically connecting the first conductive connection electrode 10 to the common voltage line VCOML through the second conductive connection electrode 9, the first conductive connection electrode 10 has to extend, along a sidewall of the corresponding via, from a surface of the second passivation layer 14 away from the first base substrate 1 to a surface of the second conductive connection electrode 9 away from the first base substrate 1. In this case, the overall segment difference of the first conductive connection electrode 10 can be effectively reduced, and thus the breaking risk of the first conductive connection electrode 10 can be reduced as well.

In some embodiments, in the conductive connection region 5, a second via h2 communicating from a surface of the second passivation layer 14 away from the first base substrate 1 to the second conductive connection electrode 9, and a third via h3 communicating from the surface of the second passivation layer 14 away from the first base substrate 1 to the common electrode 2, are formed. The first conductive connection electrode 10 is in contact with the corresponding second conductive connection electrode 9 through the second via h2, and the first conductive connection electrode 10 is in contact with a portion of the common electrode 2 in the conductive connection region 5 through the third via h3.

In some embodiments, the display substrate further includes a plurality of gate lines GL and a plurality of data lines DL. The gate lines GL extend in a first direction X, the data lines DL extend in a second direction Y, the first direction X is intersected with the second direction Y, and the plurality of gate lines GL and the plurality of data lines DL define a plurality of pixel regions PIX arranged in an array along the first direction X and the second direction Y. In an embodiment of the present disclosure, the case shown in FIG. 2, where the first direction X is a row direction, and the second direction Y is a column direction, is taken as an example for exemplary illustration.

Referring to FIGS. 3 and 4, each pixel region PIX includes an emission region P1 and a non-emission region P2 arranged in the second direction Y, and the non-emission region P2 is closer to a gate line GL corresponding to the pixel region than the emission region P1. The non-emission region P2 is formed with a corresponding thin film transistor T and further a fourth via h4 communicating from the surface of the second passivation layer 14 away from the first base substrate 1 to the second electrode Td of the thin film transistor T, while the emission region P1 is formed with the pixel electrode 8.

A gate Tg of the thin film transistor T is electrically connected to a corresponding gate line GL, a first electrode Ts of the thin film transistor T is electrically connected to a corresponding data line DL, and a portion of the pixel electrode 8 extends to the non-emission region P2 to be electrically connected to the second electrode Td of the thin film transistor T through the corresponding fourth via h4 (i.e., a portion of the pixel electrode 8 is located in the non-emission region P2). An extending direction of the common voltage line VCOML is parallel to an extending direction of the gate line GL, and the common voltage line VCOML is located in the non-emission region and on a side of the thin film transistor T close to the emission region.

In an embodiment of the present disclosure, the gate line GL is disposed in the same layer as the gate Tg of the thin film transistor T. In other words, the gate line GL, the common voltage line VCOML, and the gate Tg of the thin film transistor T are disposed in the same layer.

In some embodiments, the second via h2 and the third via h3 are both located in the non-emission region and between the corresponding common voltage line VCOML and gate line GL.

In some embodiments, the second via h2 and the third via h3 are arranged in the second direction Y.

In some embodiments, the second via h2 and the fourth via h4 are arranged in the first direction X; and the third via h3 and the fourth via h4 are arranged in the first direction X.

Referring to FIG. 4, in a row of pixel regions provided with the common voltage line VCOML, the thin film transistor T, the fourth via h4, the second via h2, and the third via h3 are all located between the common voltage line VCOML and the gate line GL, and the fourth via h4, the second via h2, and the third via h3 are arranged in the first direction X. In this case, a space of the non-emission region, in the first direction between the common voltage line VCOML and the gate line GL, can be fully and effectively utilized, which is beneficial to increasing an area ratio of the emission region in the pixel region, i.e., effectively increasing the pixel aperture ratio.

In some embodiments, each row of pixel regions PIX may be provided with one corresponding common voltage line VCOML. Apparently, it is also possible to selectively provide the common voltage line VCOML for certain one or more rows of the pixel regions PIX. All such cases should be considered within the scope of the present disclosure.

Referring to FIG. 4, in some embodiments, in the second direction Y, distances L1, L2 from the first conductive connection electrode 10 to two pixel electrodes 8 which are adjacent in the second direction Y (i.e., the shortest distances in the second direction Y from the first conductive connection electrode 10 to two pixel electrodes 8 which are adjacent in the second direction Y) are the same. With such a design, a certain process error margin can be provided between the first conductive connection electrode 10 and each of the two pixel electrodes 8 adjacent in the second direction Y.

Referring to FIGS. 5 to 7, in some embodiments, in the conductive connection region 5, a fifth via h5 communicating from the surface of the second passivation layer 14 away from the first base substrate 1 to the second conductive connection electrode 9 and the common electrode 2 is formed. The second via h2 is a portion of the fifth via h5 that is in communication with the second conductive connection electrode 9, while the third via h3 is a portion of the fifth via h5 that is in communication with the common electrode 2.

In other words, the second via h2 in the embodiment of the present disclosure is in communication with the third via h3 to form a fifth via h5; or, a portion of a fifth via h5 in the present disclosure may serve as the second via h2, while another portion of the fifth via may serve as the third via h3. In this case, only one fifth via h5 is needed in the conductive connection region 5, and the first conductive connection electrode 10 can be brought into contact with the corresponding second conductive connection electrode 9 and common electrode 2 through the only one fifth via h5.

In practical applications, the minimum via size (the projected area of a via on the substrate) that can be formed through a patterning process is limited due to limitations of the process, and is related to the material and thickness of the thin film being processed, and the like. Assuming that the minimum via size that can be formed by the patterning process in this application is a, when the second via h2 and the third via h3 are two vias arranged at an interval, a minimum aperture area 2*a is required in one conductive connection region 5 to form the second via h2 and the third via h3. Where the second via h2 and the third via h3 are two different portions of the same fifth via h5, the minimum aperture area required in the same conductive connection region 5 is a. It can be seen that by adopting one portion of one fifth via h5 as the second via h2 and the other portion as the third via h3, the aperture area can be effectively reduced, which is beneficial to reducing an overall area of the non-emission region and increasing the pixel aperture ratio.

In addition, in an embodiment of the present disclosure, the second via h2 has a depth greater than the third via h3, and the second via h2 is connected to the third via h3, to form a deep-shallow hole connection (a stepped surface) design. In the subsequent preparation process of an alignment film (also called PI film), the deep-shallow hole connection design can increase fluidity of a PI liquid during PI coating, and avoid the problem of PI uneven diffusion caused by poor fluidity of the PI liquid at a position of the deep hole.

In some embodiments, a portion of the first conductive connection electrode 10 in a region where the second via h2 is located has a thickness greater than a portion of the first conductive connection electrode 10 in a region where the third via h3 is located. In an embodiment of the present disclosure, by thickening the portion of the first conductive connection electrode 10 in the region where the second via h2 is located, the portion of the first conductive connection electrode 10 in the region where the second via h2 is located has a thickness greater than the portion of the first conductive connection electrode 10 in the region where the third via h3 is located, which can, on the one hand, reduce a resistance of the portion of the first conductive connection electrode 10 in the region where the second via h2 is located, and thus an overall resistance of the first conductive connection electrode 10, while on the other hand, can effectively reduce a depth difference between the deep hole position and the shallow hole position and facilitate uniform PI diffusion.

Figure 8:
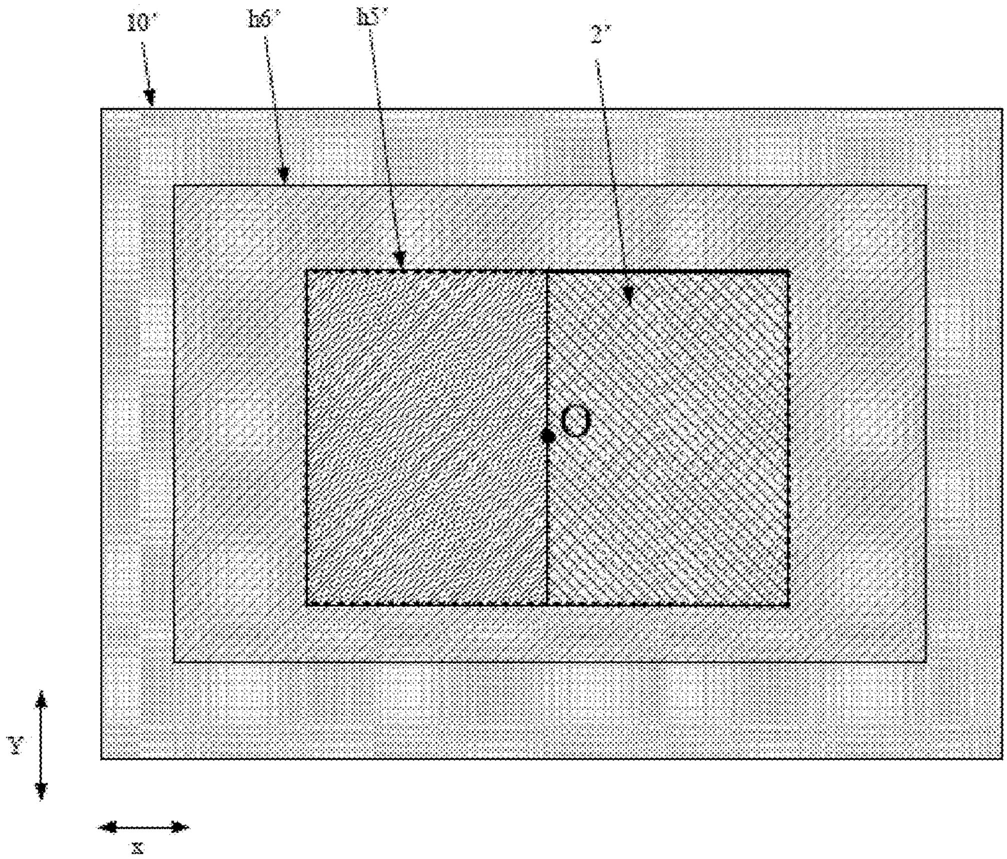
FIG. 8 is a schematic top view of orthographic projections of a fifth via, a first conductive connection electrode, and a sixth via on a first base substrate according to an embodiment of the present disclosure.

FIG. 8 is a schematic top view of orthographic projections of a fifth via, a first conductive connection electrode, and a sixth via on a first base substrate according to an embodiment of the present disclosure. As shown in FIG. 8, in some embodiments, for any fifth via h5, a bottom of the fifth via h5 has a first orthographic projection h5' on the first base substrate 1, and a portion of the common electrode 2 exposed from the fifth via h5 has a second orthographic projection 2' on the first base substrate 1; and an area of the second orthographic projection 2' is half an area of the first orthographic projection h5'.

In the present disclosure, by providing the area of the second orthographic projection 2' to be half the area of the first orthographic projection h5', the second conductive connection electrode 9 is also exposed with a sufficient area, thereby ensuring a larger contact area between the first conductive connection electrode 10 and either of the common electrode 2 and the second conductive connection electrode 9.

Apparently, the area of the second orthographic projection 2' in the present disclosure is not limited to be half the area of the first orthographic projection h5'. Specifically, a ratio of the area of the second orthographic projection 2' to the area of the first orthographic projection h5' may be defined within a certain range (for example, 20% to 80%), which can also ensure reliable electrical connection of the first conductive connection electrode 10 to both the common electrode 2 and the second conductive connection electrode 9.

In some embodiments, an edge of the second orthographic projection 2' passes through a center of the first orthographic projection h5'.

In some embodiments, the first orthographic projection h5' has a first rectangle shape, and the second orthographic projection 2' has a second rectangle shape; a length of the first rectangle in the first direction X is half a length of the second rectangle in the first direction X; and a length of the first rectangle in the second direction Y is equal to a length of the second rectangle in the second direction Y.

It should be noted that the term "rectangle" in the present disclosure includes not only right-angled rectangles, but also rounded or chamfered rectangles.

In some embodiments, the fifth via h5 and the first via h1 are arranged in the second direction Y.

In some embodiments, a center O of an orthographic projection h5' of the fifth via h5 on the first base substrate 1 is overlapped with a center of an orthographic projection 10' of the first conductive connection electrode 10 on the first base substrate 1.

In some embodiments, in the same conductive connection region 5, an orthographic projection h2' of a bottom of the second via h2 on the first base substrate 1 has a first projected area, and an orthographic projection h3' of a bottom of the third via h3 on the first base substrate 1 has a second projected area; and the first projected area is equal to the second projected area.

In some embodiments, in the same conductive connection region 5, a first contact area is provided between the first conductive connection electrode 10 and the corresponding second conductive connection electrode 9, and a second contact area is provided between the first conductive connection electrode 10 and the portion of the common electrode 2 in the conductive connection region 5; and the first contact area is equal to the second contact area.

With such a design, the secured connection of the first conductive connection electrode 10 to both the second conductive connection electrode 9 and the common electrode 2 can be enhanced.

In some embodiments, the display substrate further includes a planarization layer 13. The planarization layer 13 is located between the first passivation layer 12 and the common electrode 2, and in the conductive connection region 5, the planarization layer 13 is formed with a sixth via h6 into which a portion of the common electrode 2 is located. An orthographic projection h6' of the sixth via h6 on the first base substrate 1 covers an orthographic projection h2' of the second via h2 on the first base substrate 1 and an orthographic projection h3' of the third via h3 on the first base substrate 1.

In some embodiments, a sidewall of the planarization layer 13 defining the sixth via h6 corresponds to a slope angle between 30° to 80°.

It should be noted that the "slope angle of the sidewall" as used herein refers to an angle between the sidewall and a bottom surface of a film structure where the sidewall is located.

Taking the planarization layer as an example, generally, a smaller slope angle of the sidewall of the sixth via h6 leads to a lower breaking risk of the structures (e.g., the common electrode 2, the second passivation layer 14, the first conductive connection electrode 10, or the like) subsequently formed on the sidewall, but a larger overall size of the sixth via h6, which is not favorable for increasing the pixel aperture ratio; while a larger slope angle leads to a higher breaking risk of the structures subsequently formed on the sidewall, but a smaller overall size of the sixth via h6, which is beneficial to increasing the pixel aperture ratio. After comprehensively considering the breaking risk of the film layer, the pixel aperture ratio, and other factors, in the embodiment of the present disclosure, the sidewall of the planarization layer 13 defining the sixth via h6 is set to correspond to a slope angle between 30° to 80°.

In some embodiments, a sidewall of the first passivation layer 12 defining the second via h2 corresponds to a slope angle between 15° to 50°; and a sidewall of the second passivation layer 14 defining the third via h3 corresponds to a slope angle between 15° to 50°.

With continued reference to FIG. 8, for any sixth via h6, the sixth via h6 has a third orthographic projection h6' on the first base substrate 1, and the portion of the common electrode 2 in the sixth via h6 has a fourth orthographic projection 2' on the first base substrate 1; and an area of the fourth orthographic projection 2' is half an area of the third orthographic projection h6'.

In some embodiments, an edge of the fourth orthographic projection 2' passes through a center of the third orthographic projection h6'.

In some embodiments, the third orthographic projection h6' has a third rectangle shape, and the fourth orthographic projection 2' has a fourth rectangle shape; a length of the third rectangle in the first direction X is half a length of the fourth rectangle in the first direction X; and a length of the fourth rectangle in the second direction Y is equal to a length of the fourth rectangle in the second direction Y.

In some embodiments, the orthographic projection 10' of the first conductive connection electrode 10 on the first base substrate 1 covers the orthographic projection h6' of the sixth via h6 on the first base substrate 1. In other words, the orthographic projection of the fifth via h5 on the first base substrate 1 has an area less than or equal to the orthographic projection of the sixth via h6 on the first base substrate 1, while the orthographic projection of the sixth via h6 on the first base substrate 1 has an area less than or equal to the orthographic projection of the first conductive connection electrode 10 on the first base substrate 1. With such a design, the fifth via h5, the sixth via h6 and the first conductive connection electrode 10 can have high tolerance for alignment error.

In some embodiments, a center of the orthographic projection of the sixth via h6 on the first base substrate 1 is overlapped with the center of the orthographic projection of the first conductive connection electrode 10 on the first base substrate 1.

In some embodiments, the second via h2, the third via h3, the fifth via h5, the sixth via h6, and the first conductive connection electrode 10 each have a rectangular or approximately rectangular (chamfered rectangular) section parallel to the first base substrate 1.

As an optional example, the length of the second via h2 in the first direction X is 3.5 μm, and the length of the second via h2 in the second direction Y is 5 μm; the length of the third via h3 in the first direction X is 3.5 μm, and the length of the third via h3 in the second direction Y is 5 μm; the length of the fifth via h5 in the first direction X is 7 μm, and the length of the fifth via h5 in the second direction Y is 5 μm; the length of the sixth via h6 in the first direction X is 12 μm, and the length of the sixth via h6 in the second direction Y is 7 μm; and the length of the first conductive connection electrode 10 in the first direction X is 15 μm, and the length of the first conductive connection electrode 10 in the second direction Y is 12 μm.

As an optional example, the common voltage line VCOML has a thickness of about 3350 Å, the insulation layer 11 has a thickness of about 4000 Å, the first electrode Ts and the second electrode Td each has a thickness of about 3500 Å, the active layer Ta has a thickness of about 900 Å, the first passivation layer 12 has a thickness of about 1000 Å, the planarization layer 13 has a thickness of about 25,000 Å, the common electrode 2 has a thickness of about 900 Å, the second passivation layer 14 has a thickness of about 3000 Å, and the pixel electrode 8 has a thickness of about 700 Å. In this case, the second via h2 has a depth of about 2.97 μm, and the third via h3 has a depth of about 2.8 μm.

With continued reference to the above FIG. 4, the common electrode 2 is formed with an eighth via h8, and an orthographic projection of the eighth via h8 on the first base substrate 1 completely covers a region where the fourth via h4 is to be formed subsequently, so as to ensure that the subsequently formed fourth via h4 can be communicated to the second electrode Td of the thin film transistor T. The orthographic projection of the eighth via h8 on the first base substrate 1 also completely covers a region where the second via h2 is to be formed subsequently, so as to ensure that the subsequently formed second via h2 can be communicated to the second conductive connection electrode 9.

With continued reference to FIG. 2, in some embodiments, a common voltage peripheral lead 3 is disposed in each of two side peripheral regions 1*b* of the display region 1*a* disposed opposite to each other in the first direction X, and two ends of the common voltage line VCOML extend to the peripheral regions 1*b* to be electrically connected to the respective common voltage peripheral leads 3. With such a design, the loading speed of the common voltage signal onto the common voltage line VCOML can be increased, which is beneficial to further increasing the loading speed of the common voltage signal onto the common electrode 2.

In some embodiments, the common voltage peripheral lead 3 is provided around the display region 1*a*. The display substrate further includes a common voltage write lead 7 in the peripheral region 1*b* on a side of the common voltage peripheral lead 3 away from the display region. The common voltage write lead 7 is electrically connected to the common voltage peripheral lead 3 (e.g., through a conductive connection structure 6). A common voltage signal supplied from an external chip (not shown) may be received through the voltage write lead, and transmitted to the common voltage peripheral lead 3.

Figure 9:
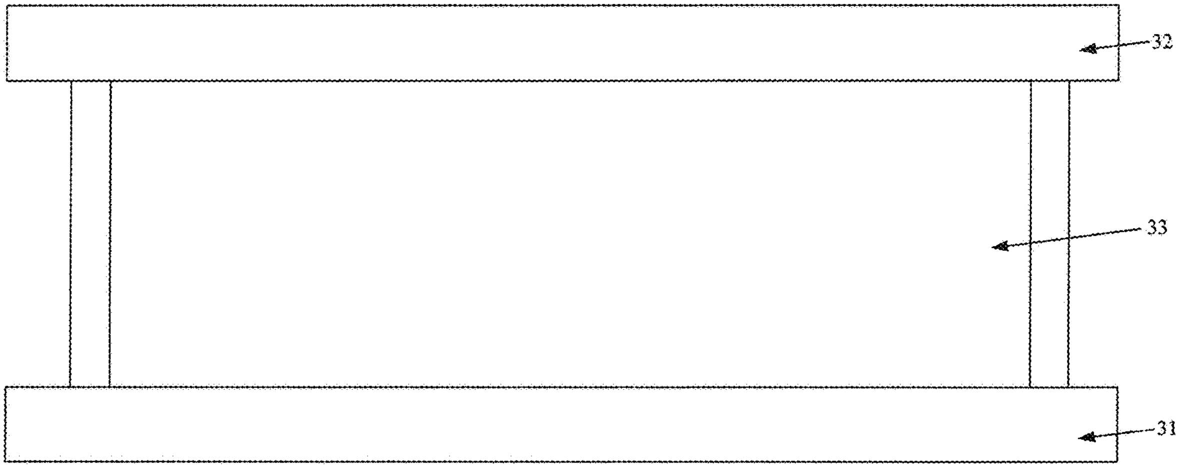
FIG. 9 is a schematic structural diagram of a display apparatus according to an embodiment of the present disclosure.

Based on the same inventive concept, an embodiment of the present disclosure further provides a display apparatus. FIG. 9 is a schematic structural diagram of a display apparatus according to an embodiment of the present disclosure. As shown in FIG. 9, the display apparatus includes the display substrate according to any embodiment described above, and an opposite substrate to be aligned and assembled with the display substrate. A spacer and a liquid crystal layer are disposed between the display substrate and the opposite substrate. For the description of the display substrate, reference may be made to the contents in the foregoing embodiments, and details are not repeated here.

In some embodiments, the display substrate may be an array substrate, and the opposite substrate may be a color filter substrate. The color filter substrate may include a second base substrate and a color filter on a side of the second base substrate facing the array substrate.

The display apparatus provided in the embodiment may be a wearable device, a mobile phone, a tablet, a television, a monitor, a laptop, a digital album, a navigator or any other product or component having a display function. Other essential components of the display device are regarded as present by those skilled in the art, which are not described herein and should not be construed as limiting the present disclosure.

Figure 10:
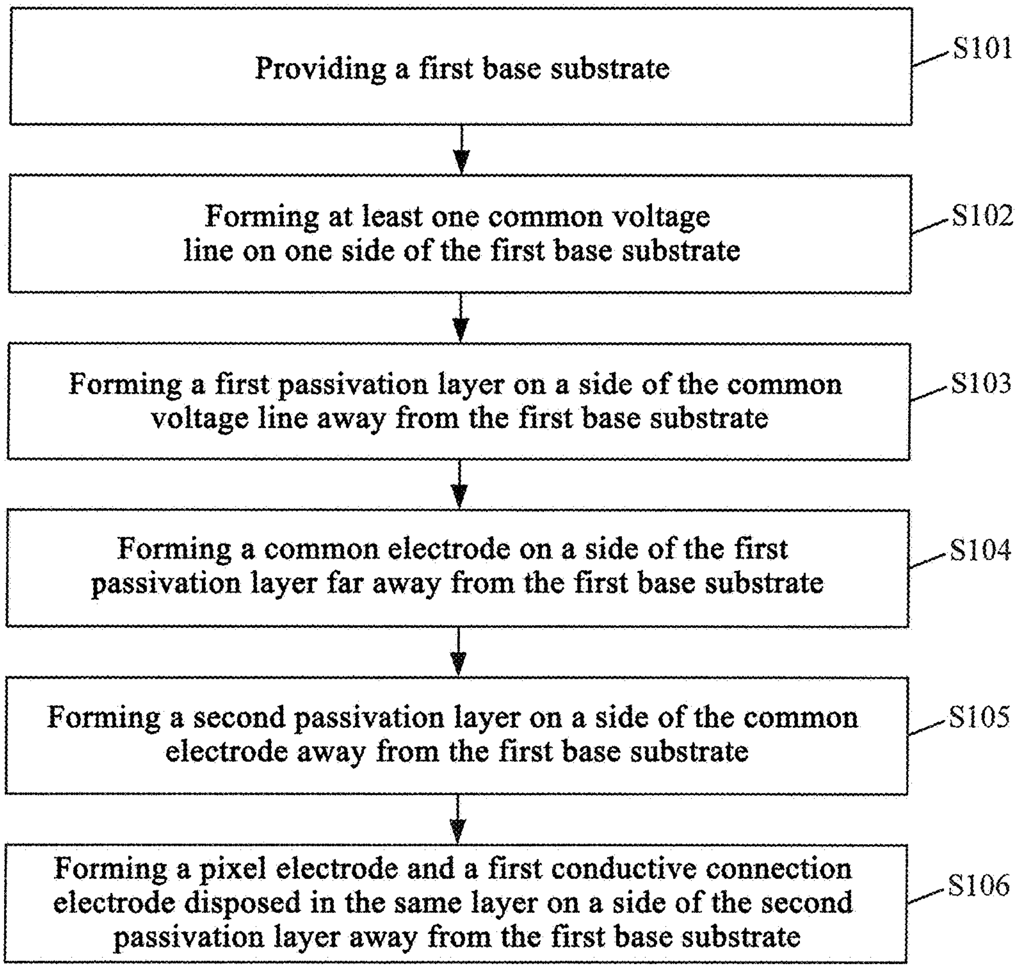
FIG. 10 is a flowchart of a method for preparing a display substrate according to an embodiment of the present disclosure.

Based on the same inventive concept, an embodiment of the present disclosure further provides a method for preparing a display apparatus, which may be applied to prepare the display substrate according to any embodiment described above. FIG. 10 is a flowchart of a method for preparing a display substrate according to an embodiment of the present disclosure. As shown in FIG. 10, the method includes the following steps S101 to S106.

At step S101, providing a first base substrate including a display region and a peripheral region surrounding the display region.

At step S102, forming at least one common voltage line on one side of the first base substrate. The common voltage line is located in the display region, and each common voltage line is configured with at least one conductive connection region.

At step S103, forming a first passivation layer on a side of the common voltage line away from the first base substrate.

At step S104, forming a common electrode on a side of the first passivation layer far away from the first base substrate.

At step S105, forming a second passivation layer on a side of the common electrode away from the first base substrate.

At step S106, forming a pixel electrode and a first conductive connection electrode disposed in the same layer on a side of the second passivation layer away from the first base substrate. The first conductive connection electrode is located in the corresponding conductive connection region, and the common electrode is electrically connected to the common voltage line through the first conductive connection electrode.

In one aspect, in an embodiment of the present disclosure, the display region is provided with common voltage lines each configured with at least one conductive connection region, and the common electrode is electrically connected to each common voltage line through the first conductive connection electrode in the conductive connection region. Compared with the technical solution in the existing art of providing the common voltage signal to the common electrode by only the common voltage peripheral lead in the peripheral region, the display substrate provided in the embodiments of the present disclosure can provide the common voltage signal to the common electrode by not only the common voltage peripheral lead in the peripheral region, but also the common voltage line in the display region, so that a loading speed of the common voltage signal onto the common electrode can be effectively increased, the common voltage signal delay can be reduced, and the stability of the common voltage signal can be improved.

On the other hand, in an embodiment of the present disclosure, since the first conductive connection electrode and the pixel electrode are disposed in the same layer, the first conductive connection electrode and the pixel electrode can be prepared based on the same MASK process, so that the number of MASK processes is not increased due to the provision of the first conductive connection electrode.

Figure 11:
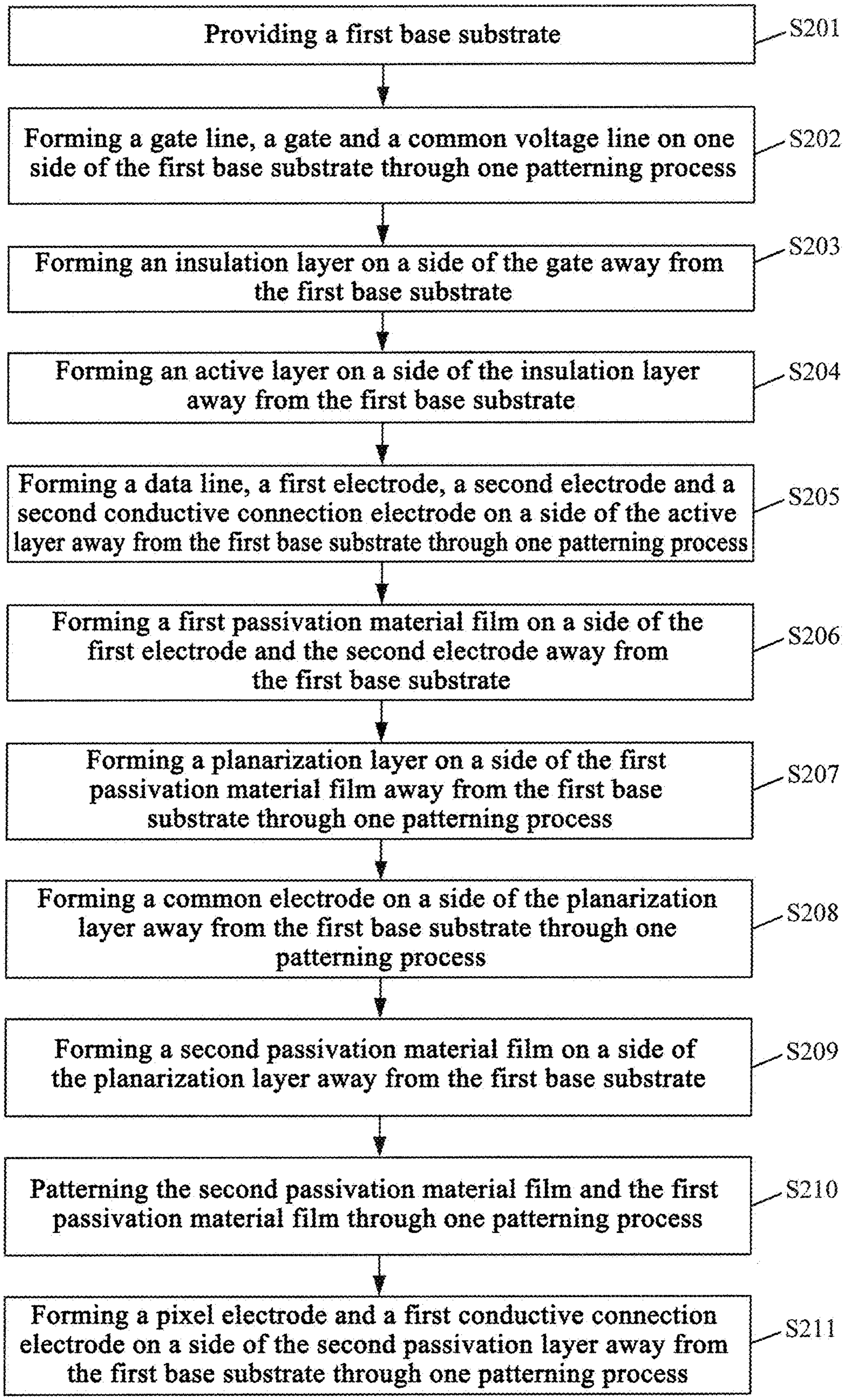
FIG. 11 is another flowchart of a method for preparing a display substrate according to an embodiment of the present disclosure.
Figure 12A:
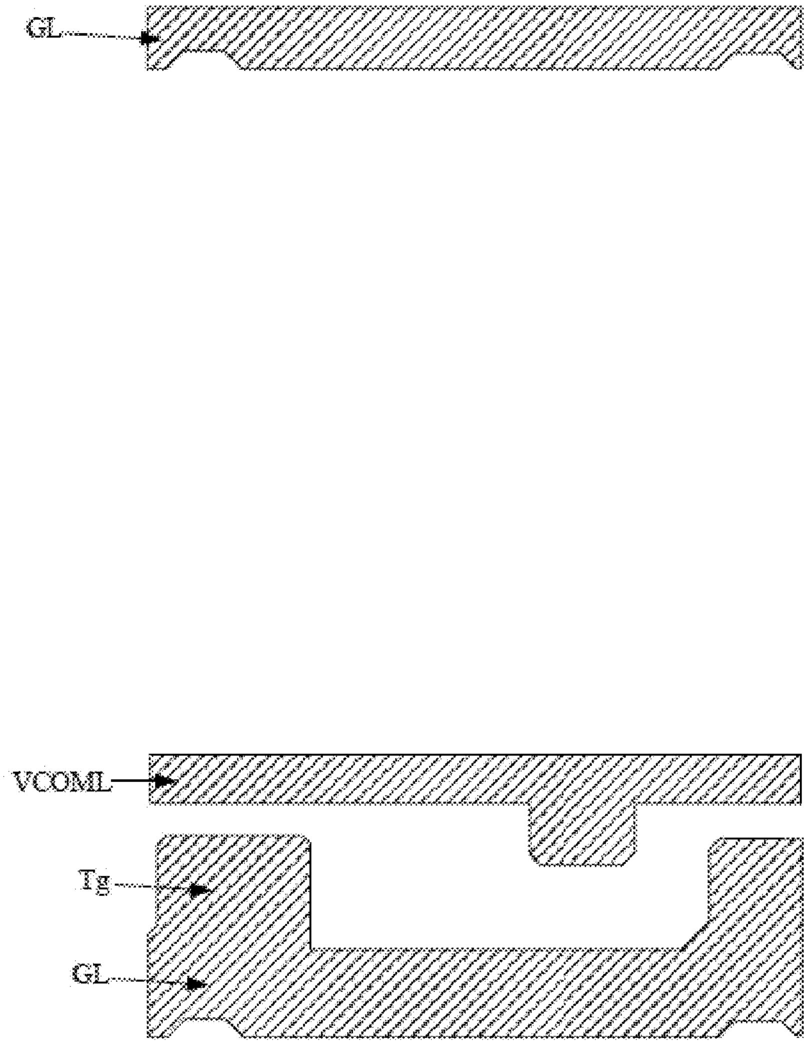
FIGS. 12A to 12J are schematic top views showing partial regions of intermediate products formed in the method in FIG. 11.
Figure 12B:
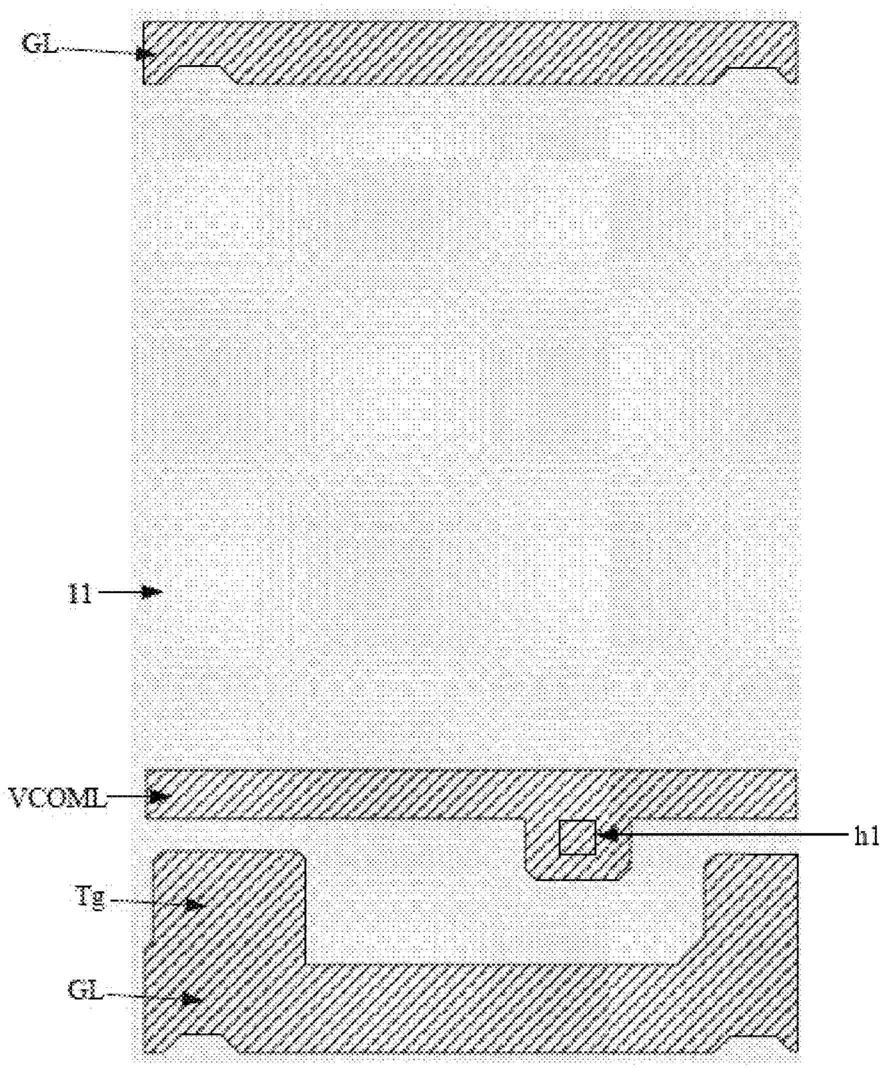
Figure 12C:
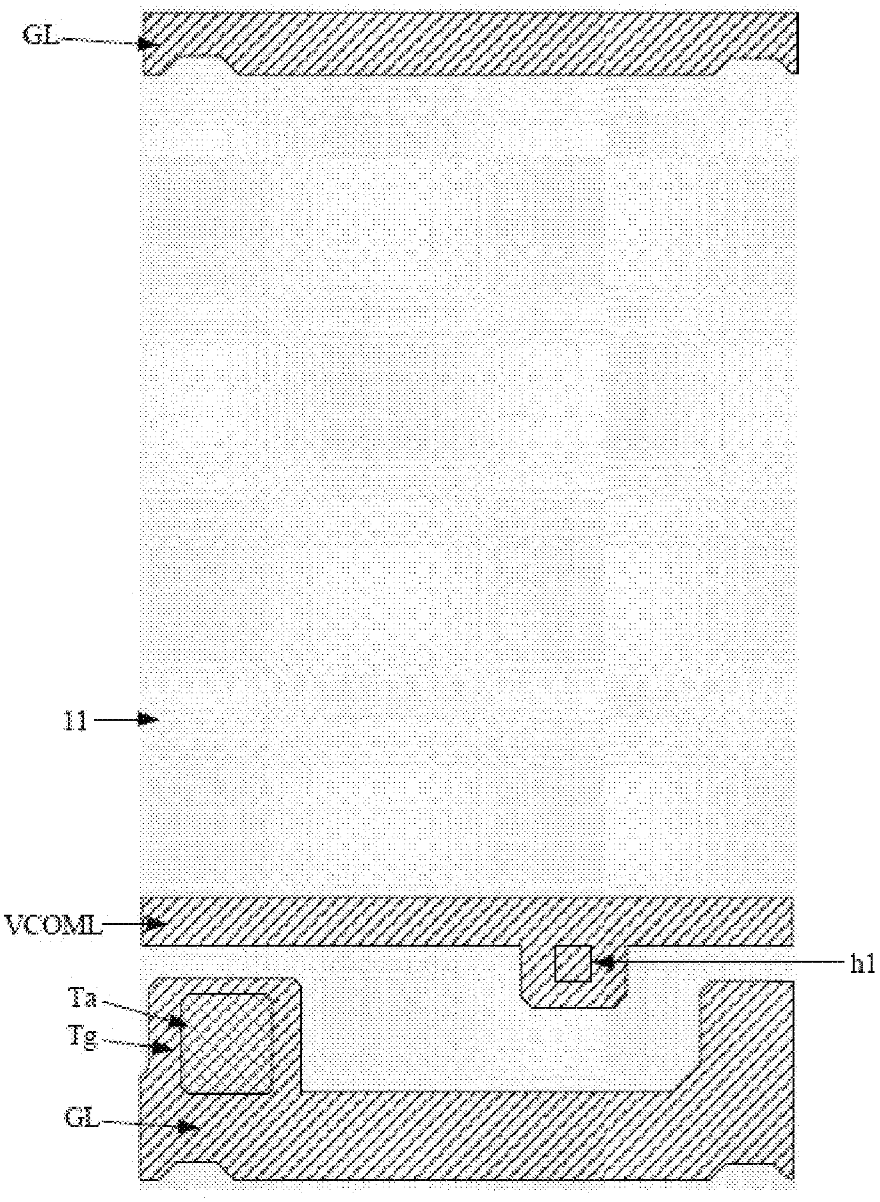
Figure 12D:
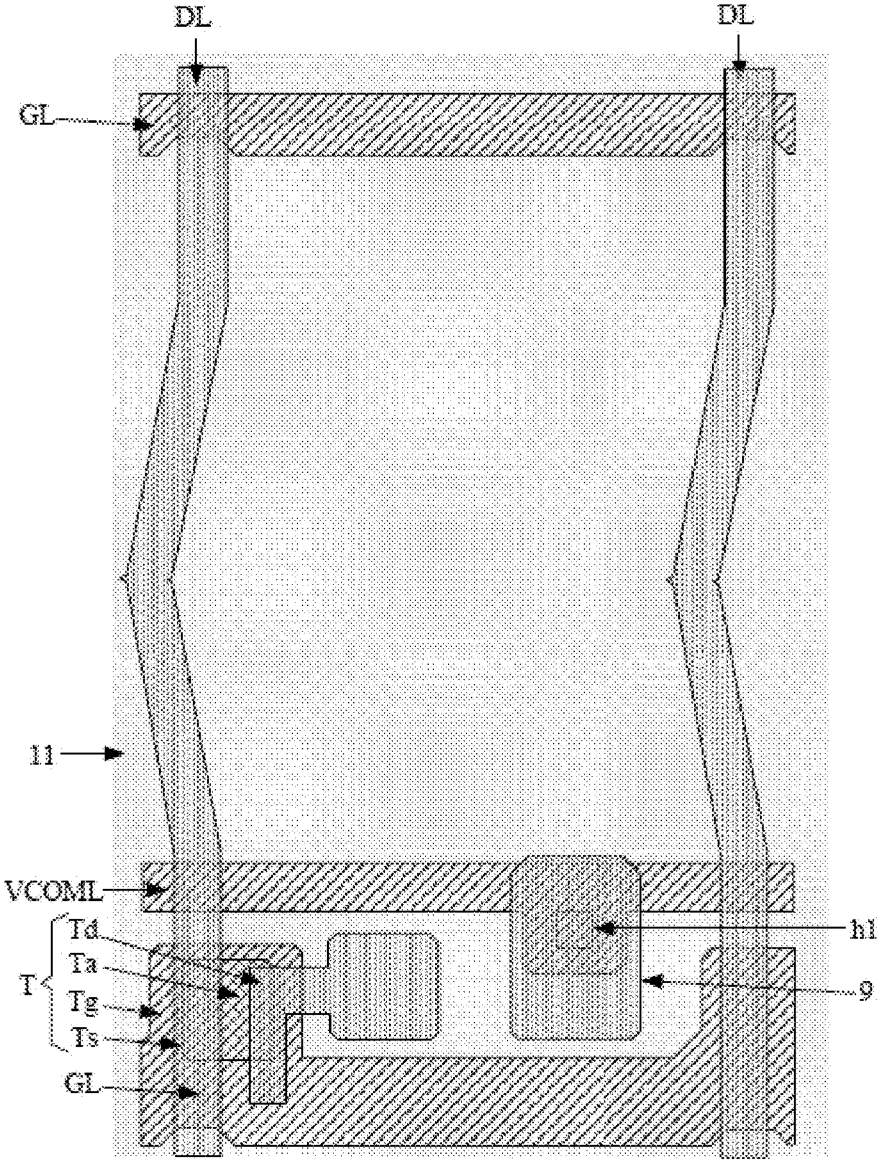
Figure 12E:
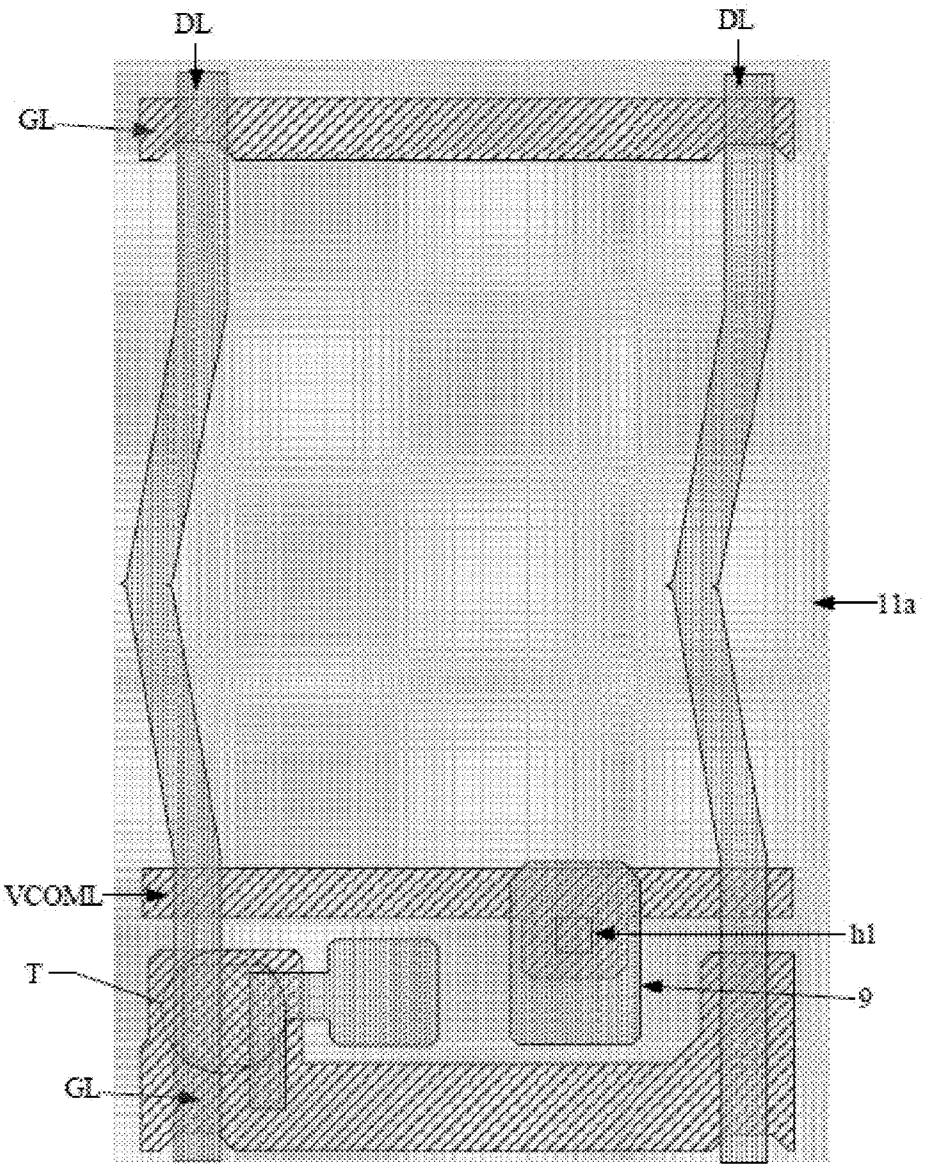
Figure 12F:
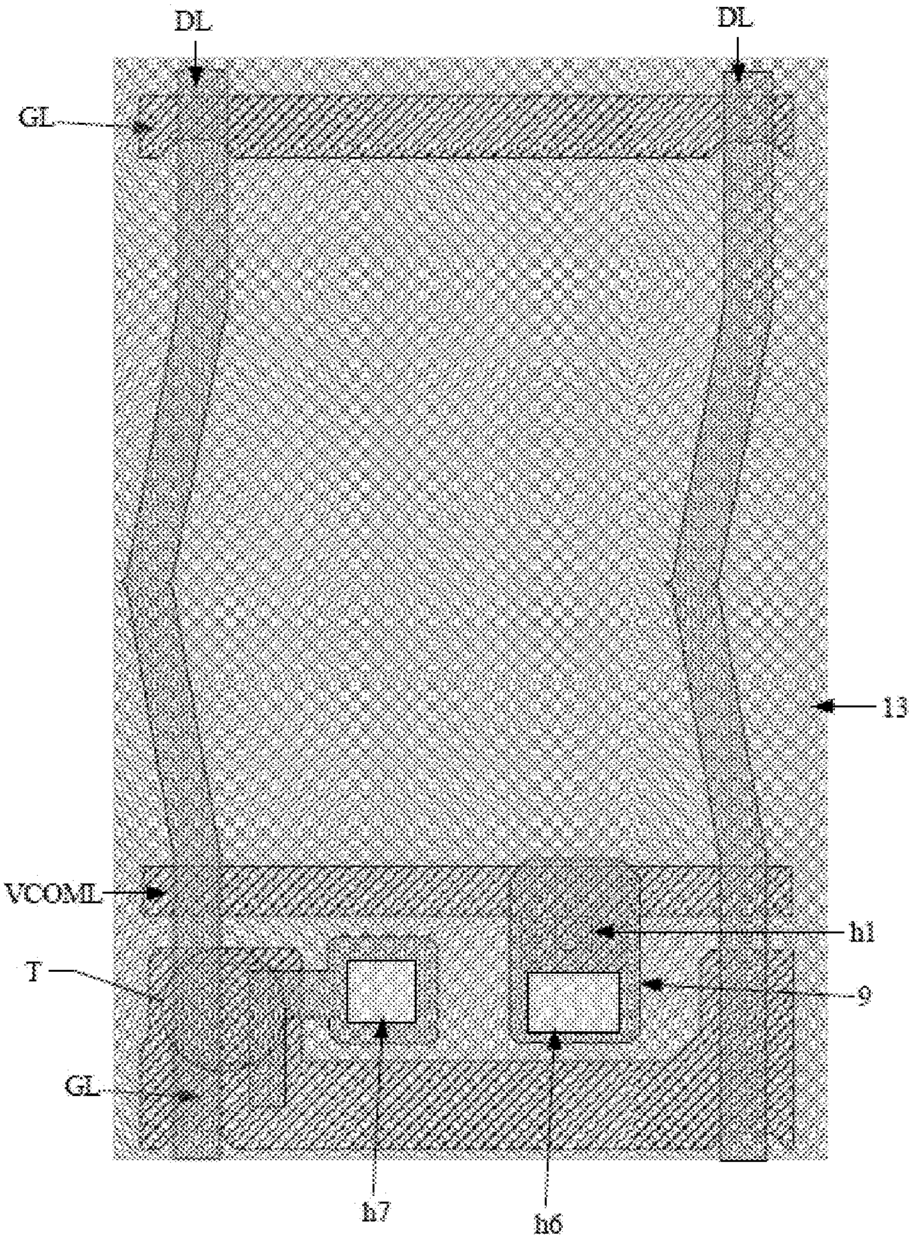
Figure 12G:
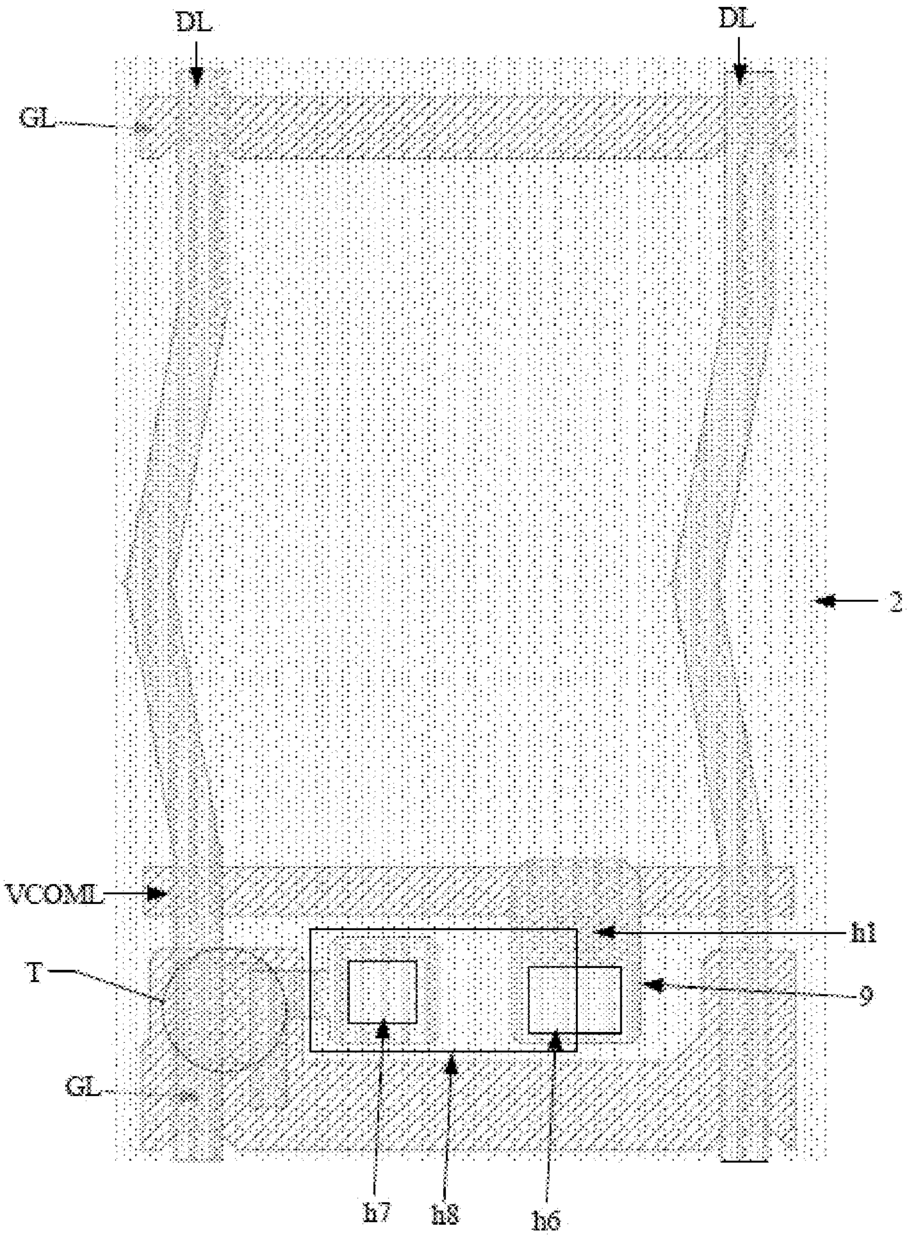
Figure 12H:
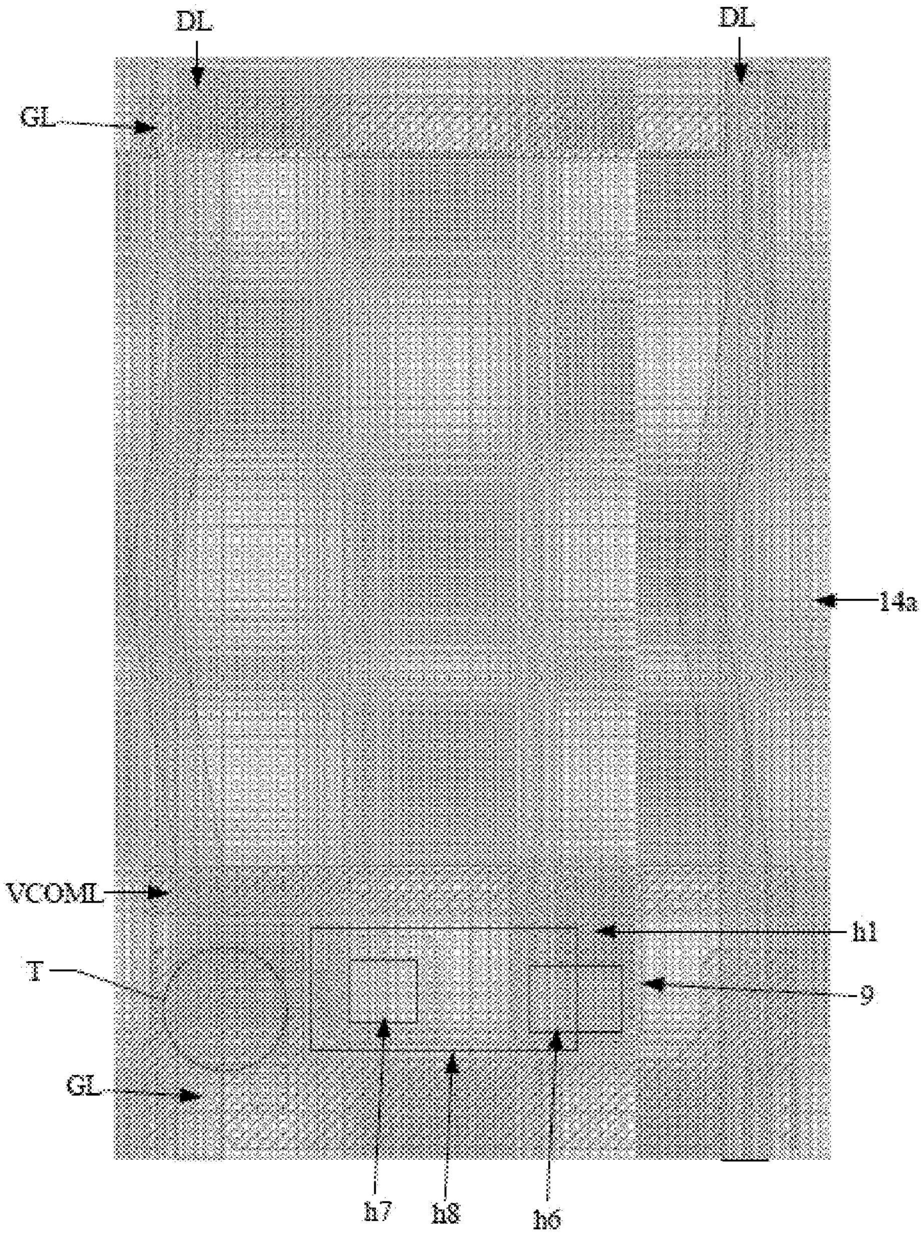
Figure 12I:
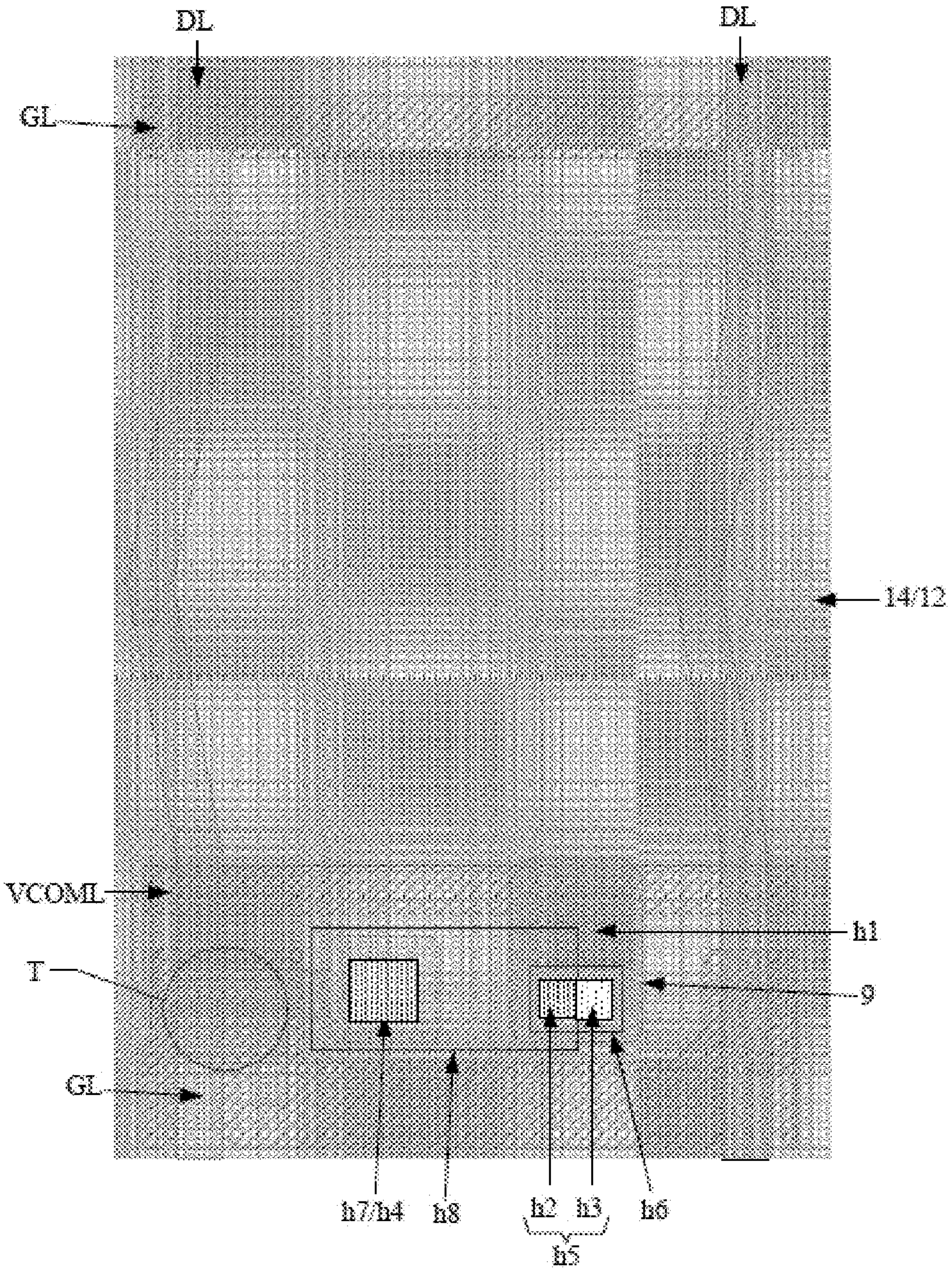
Figure 12J:
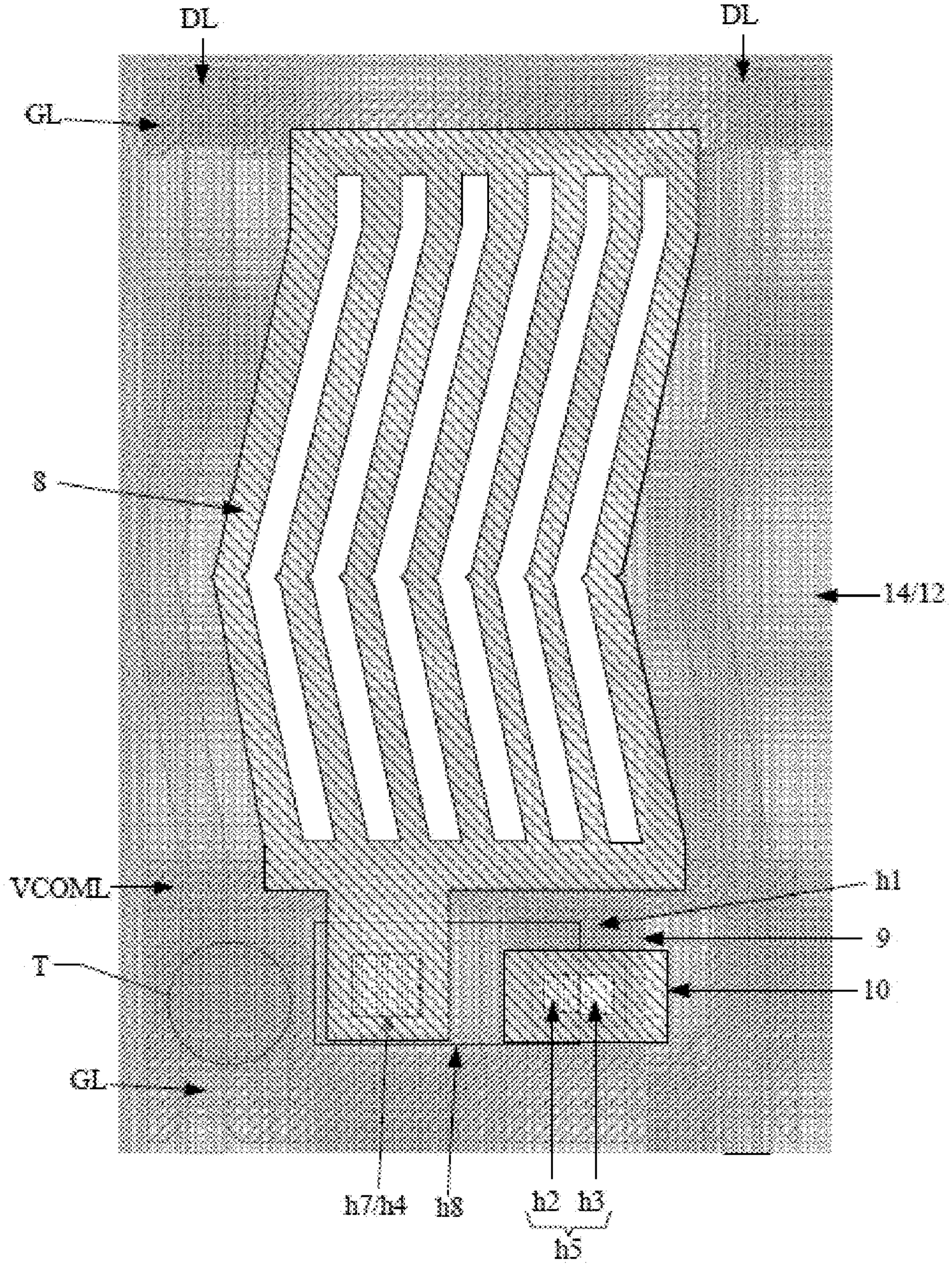

FIG. 11 is another flowchart of a method for preparing a display substrate according to an embodiment of the present disclosure, and FIGS. 12A to 12J are schematic top views showing partial regions of intermediate products formed in the method in FIG. 11. As shown in FIGS. 11 to 12J, the method includes the following steps S201 and S211.

At step S201, providing a first base substrate.

The first base substrate includes a display region and a peripheral region surrounding the display region.

At step S202, forming a gate line, a gate and a common voltage line on one side of the first base substrate through one patterning process.

Referring to FIG. 12A, a first conductive material film is firstly formed, where the first conductive material may be a metal material, such as copper, aluminum, molybdenum or alloys thereof; and then the first conductive material film is patterned based on a patterning process to form patterns of the gate line GL, the gate Tg, and the common voltage line VCOML.

At step S203, forming an insulation layer on a side of the gate away from the first base substrate.

Referring to FIG. 12B, an insulating material film is firstly formed, where the insulating material may include silicon oxide, silicon nitride, or the like; and then the insulating material film is patterned based on a patterning process to form a pattern of the insulation layer 11. The insulation layer 11 is formed with a first via h1 communicated to the common voltage line VCOML.

At step S204, forming an active layer on a side of the insulation layer away from the first base substrate.

Referring to FIG. 12C, an active material film is firstly formed, where the active material may be an oxide type active material; and then the active material film is patterned based on a patterning process to form a pattern of the active layer Ta positioned in a region where the gate Tg is located.

At step S205, forming a data line, a first electrode, a second electrode and a second conductive connection electrode on a side of the active layer away from the first base substrate through one patterning process.

Referring to FIG. 12D, a second conductive material film is firstly formed, where the second conductive material may be a metal material, such as copper, aluminum, molybdenum or alloys thereof; and then the second conductive material film is patterned based on a patterning process to form patterns of the data line DL, the first electrode Ts, the second electrode Tg, and the second conductive connection electrode 9.

The first electrode and the second electrode are each connected to the active layer, the first electrode is further connected to the corresponding data line, and the second conductive connection electrode is connected to the common voltage line through the corresponding first via.

At step S206, forming a first passivation material film on a side of the first electrode and the second electrode away from the first base substrate.

Referring to FIG. 12E, a first passivation material film 11*a* is formed on a surface of the substrate shown in FIG. 12D through a deposition process; where the first passivation material includes silicon oxide and/or silicon nitride.

At step S207, forming a planarization layer on a side of the first passivation material film away from the first base substrate through one patterning process.

Referring to FIG. 12F, a planarization material film is firstly formed, the planarization material film may include an organic material such as photoresist; and then the planarization material film is patterned based on a patterning process to form a pattern of the planarization layer 13 formed with the sixth via h6 and the seventh via h7. The sixth via h6 completely covers a region where the second and third vias (i.e., the fifth via) are to be formed subsequently; and the seventh via h7 completely covers a region where the fourth via is to be formed subsequently.

At step S208, forming a common electrode on a side of the planarization layer away from the first base substrate through one patterning process.

Referring to FIG. 12G, a common electrode material film is firstly formed, where the common electrode material may include a transparent conductive material, such as a metal oxide material; and then the common electrode material film is patterned based on a patterning process to obtain a pattern of the common electrode 2. A portion of the common electrode 2 is located in the sixth via h6.

In addition, the common electrode is formed with an eighth via h8, and an orthographic projection of the eighth via h8 on the first base substrate completely covers a region where the fourth via is to be formed subsequently and a region where the second via is to be formed subsequently.

At step S209, forming a second passivation material film on a side of the planarization layer away from the first base substrate.

Referring to FIG. 12H, a second passivation material film 14*a* is formed on the substrate surface shown in FIG. 12F through a deposition process; where the second passivation material includes silicon oxide and/or silicon nitride.

At step S210, patterning the second passivation material film and the first passivation material film through one patterning process, to obtain patterns of the first passivation layer and the second passivation layer.

Referring to FIG. 12I, the second passivation material film and the first passivation material film are patterned through one patterning process, to obtain patterns of the first passivation layer 12 and the second passivation layer 14. In the conductive connection region, the second via h2 communicating from a surface of the second passivation layer away from the first base substrate to the second conductive connection electrode 9, the third via h3 communicating from the surface of the second passivation layer 14 away from the first base substrate to the common electrode 2, and the fourth via h4 communicating from the surface of the second passivation layer 14 away from the first base substrate to the second electrode, are formed.

Orthographic projections of the second via h2 and the third via h3 on the first base substrate are located within a region defined by an orthographic projection of the sixth via h6 on the first base substrate, and an orthographic projection of the fourth via h4 on the first base substrate is located within a region defined by an orthographic projection of the seventh via h7 on the first base substrate.

In some embodiments, the second via h2 and the third via h3 are two different portions of the same fifth via (e.g., the fifth via h5 discussed in the above embodiments). The orthographic projections of the second via h2 and the third via h3 on the first base substrate are both located in a coverage region of the orthographic projection of the sixth via h6 on the first base substrate.

In the embodiment of the present disclosure, rather than being directly connected to the common voltage line through a via in the first passivation layer, the common electrode is electrically connected to the common voltage line through the first conductive connection electrode on the side of the common electrode away from the first base substrate, so that the MASK process for the first passivation layer may be performed after the MASK process for the common electrode. In other words, the MASK process for the first passivation layer may be the same as the MASK process for the second passivation layer on the side of the common electrode away from the first base substrate (i.e., the first passivation layer and the second passivation layer are subjected to the MASK process at the same time), so that the number of MASK processes can be effectively reduced.

At step S211, forming a pixel electrode and a first conductive connection electrode on a side of the second passivation layer away from the first base substrate through one patterning process.

Referring to FIG. 12J, a pixel electrode 8 material film is firstly formed, where the pixel electrode 8 material may include a transparent conductive material, such as a metal oxide material; and then, the pixel electrode 8 material film is patterned based on a patterning process to obtain patterns of the pixel electrode 8 and the first conductive connection electrode 10, where the pixel electrode 8 is a slit electrode. The pixel electrode 8 is connected to the second electrode Td of the corresponding thin film transistor through the fourth via, the first conductive connection electrode 10 is connected to the corresponding second conductive connection electrode 9 through the second via h2, and the first conductive connection electrode 10 is connected to the common electrode 2 through the third via h3.

It will be appreciated that the above implementations are merely exemplary implementations for the purpose of illustrating the principle of the present disclosure, and the present disclosure is not limited thereto. It will be apparent to those skilled in the art that various modifications and variations may be made without departing from the spirit or essence of the present disclosure. Such modifications and variations should also be considered as falling into the protection scope of the present disclosure.

What is claimed is:

1. A display substrate, comprising:

a first base substrate, comprising a display region and a peripheral region surrounding the display region;

at least one common voltage line in the display region, each common voltage line being configured with at least one conductive connection region;

a first passivation layer on a side of the common voltage line away from the first base substrate;

a common electrode on a side of the first passivation layer away from the first base substrate;

a second passivation layer on a side of the common electrode away from the first base substrate;

a pixel electrode on a side of the second passivation layer away from the first base substrate; and a first conductive connection electrode in a corresponding one of the at least one conductive connection region and in the same layer as the pixel electrode, wherein the common electrode is electrically connected to the common voltage line through the first conductive connection electrode, wherein the display substrate further comprises:

a plurality of thin film transistors between the first base substrate and the first passivation layer;

wherein the common voltage line is in the same layer as a gate of each thin film transistor.

2. The display substrate according to claim 1, wherein a first electrode and a second electrode of each thin film transistor are on a side of the gate of the thin film transistor away from the first base substrate, with an insulation layer between the first and second electrodes of the thin film transistor and the gate of the thin film transistor; and the display substrate further comprises:

a second conductive connection electrode in the corresponding conductive connection region and in the same layer as the first electrode and the second electrode of the thin film transistor, wherein the second conductive connection electrode is in contact with the common voltage line through a first via in the insulation layer; and the first conductive connection electrode is electrically connected to the common voltage line through the second conductive connection electrode.

3. The display substrate according to claim 2, wherein in the conductive connection region, a second via communicating from a surface of the second passivation layer away from the first base substrate to the second conductive connection electrode, and a third via communicating from the surface of the second passivation layer away from the first base substrate to the common electrode, are formed; and the first conductive connection electrode is in contact with the corresponding second conductive connection electrode through the second via, and the first conductive connection electrode is in contact with a portion of the common electrode in the conductive connection region through the third via.

4. The display substrate according to claim 3, further comprising:

a plurality of gate lines and a plurality of data lines, wherein each of the gate lines extend in a first direction, each of the data lines extend in a second direction, the first direction is intersected with the second direction, and the plurality of gate lines and the plurality of data lines define a plurality of pixel regions arranged in an array along the first direction and the second direction;

each pixel region comprises an emission region and a non-emission region arranged in the second direction, and the non-emission region is closer to a gate line corresponding to the pixel region than the emission region;

the non-emission region is formed with a corresponding thin film transistor and further a fourth via communicating from the surface of the second passivation layer away from the first base substrate to the second electrode of the thin film transistor, while the emission region is formed with the pixel electrode;

a gate of the thin film transistor is electrically connected to a corresponding gate line, a first electrode of the thin film transistor is electrically connected to a corresponding data line, and the pixel electrode is electrically connected to a second electrode of the thin film transistor through the corresponding fourth via; and an extending direction of the common voltage line is parallel to an extending direction of the gate line, and the common voltage line is in the non-emission region and on a side of the thin film transistor close to the emission region.

5. The display substrate according to claim 4, wherein the second via and the third via are both in the non-emission region and between the corresponding common voltage line and gate line.

6. The display substrate according to claim 5, wherein the second via and the third via are arranged in the first direction, and/or wherein the second via and the fourth via are arranged in the first direction; and the third via and the fourth via are arranged in the first direction, and/or wherein in the second direction, distances from the first conductive connection electrode to two pixel electrodes which are adjacent in the second direction are the same.

7. The display substrate according to claim 4, wherein in the conductive connection region, a fifth via communicating from the surface of the second passivation layer away from the first base substrate to the second conductive connection electrode and the common electrode is formed; and the second via is a portion of the fifth via that is in communication with the second conductive connection electrode, while the third via is a portion of the fifth via that is in communication with the common electrode.

8. The display substrate according to claim 7, wherein for any fifth via, a bottom of the fifth via has a first orthographic projection on the first base substrate, and a portion of the common electrode exposed from the fifth via has a second orthographic projection on the first base substrate; and an area of the second orthographic projection is half an area of the first orthographic projection.

9. The display substrate according to claim 8, wherein an edge of the second orthographic projection passes through a center of the first orthographic projection, and/or wherein the first orthographic projection has a first rectangle shape, and the second orthographic projection has a second rectangle shape;

a length of the first rectangle in the first direction is half a length of the second rectangle in the first direction; and a length of the first rectangle in the second direction is equal to a length of the second rectangle in the second direction, and/or wherein the fifth via and the first via are arranged in the second direction, and/or wherein a center of an orthographic projection of the fifth via on the first base substrate is overlapped with a center of an orthographic projection of the first conductive connection electrode on the first base substrate.

10. The display substrate according to claim 3, wherein in the same conductive connection region, an orthographic projection of a bottom of the second via on the first base substrate has a first projected area, and an orthographic projection of a bottom of the third via on the first base substrate has a second projected area; and the first projected area is equal to the second projected area, and/or wherein in the same conductive connection region, a first contact area is between the first conductive connection electrode and the corresponding second conductive connection electrode, and a second contact area is between the first conductive connection electrode and the portion of the common electrode in the conductive connection region; and the first contact area is equal to the second contact area.

11. The display substrate according to claim 3, further comprising:

a planarization layer between the first passivation layer and the common electrode, wherein in the conductive connection region, the planarization layer is formed with a sixth via into which a portion of the common electrode is located; and an orthographic projection of the sixth via on the first base substrate covers an orthographic projection of the second via on the first base substrate and an orthographic projection of the third via on the first base substrate.

12. The display substrate according to claim 11, wherein for any sixth via, the sixth via has a third orthographic projection on the first base substrate, and the portion of the common electrode in the sixth via has a fourth orthographic projection on the first base substrate; and an area of the fourth orthographic projection is half an area of the third orthographic projection.

13. The display substrate according to claim 12, wherein an edge of the fourth orthographic projection passes through a center of the third orthographic projection, and/or wherein the third orthographic projection has a third rectangle shape, and the fourth orthographic projection has a fourth rectangle shape;

a length of the third rectangle in the first direction is half a length of the fourth rectangle in the first direction; and a length of the fourth rectangle in the second direction is equal to a length of the fourth rectangle in the second direction.

14. The display substrate according to claim 11, wherein the orthographic projection of the first conductive connection electrode on the first base substrate covers the orthographic projection of the sixth via on the first base substrate, and/or wherein a center of the orthographic projection of the sixth via on the first base substrate is overlapped with the center of the orthographic projection of the first conductive connection electrode on the first base substrate, and/or wherein a sidewall of the planarization layer defining the sixth via corresponds to a slope angle between 30° to 80°.

15. The display substrate according to claim 3, wherein a sidewall of the first passivation layer defining the second via corresponds to a slope angle between 15° to 50°; and a sidewall of the second passivation layer defining the third via corresponds to a slope angle between 15° to 50°.

16. The display substrate according to claim 3, further comprising:

a common voltage peripheral lead in the peripheral region; wherein the common electrode extends to the peripheral region to be electrically connected to the common voltage peripheral lead.

17. The display substrate according to claim 16, wherein two ends of the common voltage line each extend to the peripheral region, and are each electrically connected to the common voltage peripheral lead.

18. The display substrate according to claim 16, wherein the common voltage peripheral lead is around the display region;

the display substrate further comprises a common voltage write lead in the peripheral region on a side of the common voltage peripheral lead away from the display region; and the common voltage write lead is electrically connected to the common voltage peripheral lead.

19. A display apparatus, comprising: the display substrate according to claim 1, and an opposite substrate opposite to the display substrate.

* * * * *